(12) United States Patent
Aoki

(10) Patent No.: US 7,009,687 B2
(45) Date of Patent: Mar. 7, 2006

(54) SUPPORT UNIT, OPTICAL UNIT AND EXPOSURE APPARATUS, AND DEVICE MANUFACTURING METHOD

(75) Inventor: Takashi Aoki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/969,071

(22) Filed: Oct. 21, 2004

(65) Prior Publication Data

US 2005/0117138 A1 Jun. 2, 2005

Related U.S. Application Data

(63) Continuation of application No. PCT/JP2003/005105, filed on Apr. 22, 2003.

(30) Foreign Application Priority Data

Apr. 22, 2002 (JP) .................................... 2002-118730

(51) Int. Cl.
G03B 27/54 (2006.01)
G02B 21/00 (2006.01)

(52) U.S. Cl. ........................................ 355/67; 359/611
(58) Field of Classification Search ................ 355/30, 355/53, 67, 72–76; 359/611–620
See application file for complete search history.

(56) References Cited

U.S. PATENT DOCUMENTS

| | | | |
|---|---|---|---|
| 4,733,945 A | 3/1988 | Bacich | |
| 5,559,584 A | 9/1996 | Miyaji et al. | |
| 5,973,764 A | 10/1999 | McCullough et al. | |
| 6,043,863 A | 3/2000 | Ikeda | |
| 6,122,114 A | 9/2000 | Sudo et al. | |
| 6,144,504 A | 11/2000 | Sudoh et al. | |
| 6,226,133 B1 | 5/2001 | Osakabe | |
| 6,239,924 B1 | 5/2001 | Watson et al. | |
| 6,288,769 B1 | 9/2001 | Akagawa et al. | |
| 6,545,746 B1 | 4/2003 | Nishi | |
| 6,583,850 B1 | 6/2003 | Hummel et al. | |
| 6,633,364 B1 | 10/2003 | Hayashi | |
| 6,686,989 B1 * | 2/2004 | Hagiwara et al. | 355/30 |
| 2003/0202165 A1 | 10/2003 | Shiraishi | |

FOREIGN PATENT DOCUMENTS

| | | |
|---|---|---|
| EP | 0 952 490 A2 | 10/1999 |
| JP | 11-14876 | 1/1999 |
| JP | 11-67651 | 3/1999 |
| JP | 2000-294481 | 10/2000 |
| JP | 2001123364 * | 9/2001 |
| WO | WO 02/39491 A1 | 5/2002 |

* cited by examiner

Primary Examiner—Henry Hung Nguyen
(74) Attorney, Agent, or Firm—Oblon, Spivak, McClelland, Maier & Neustadt, P.C.

(57) ABSTRACT

Exposure light can pass through a partition wall parallel plate via the opening of the second wall and the opening of the first wall, the first opposing surface of the first wall and the second opposing surface of the second wall respectively oppose one surface and the other surface of the partition wall parallel plate via the first clearance and the second clearance, and the partition wall parallel plate is supported at least at three points such that the third opposing surface of the third wall opposes the entire peripheral surface of the partition wall parallel plate. Further, the third clearance is connected to an exhaust route. Specifically, unnecessary stress is not applied to the partition wall parallel plate, and even if gas tries to flow from space on one side of the partition wall parallel plate into the other space, mixing of gases between two spaces can be effectively suppressed because gas in the third clearance is forcibly exhausted outside via the exhaust route.

27 Claims, 9 Drawing Sheets

SUPPORT UNIT, OPTICAL UNIT AND EXPOSURE APPARATUS, AND DEVICE MANUFACTURING METHOD

CROSS-REFERENCE TO RELATED APPLICATIONS

This is a continuation of International Application PCT/JP2003/005105, with an international filing date of Apr. 22, 2003, the entire content of which being hereby incorporated herein by reference, which was not published in English.

BACKGROUND OF THE INVENTION

1. Field of the Invention

The present invention relates to a support unit, an optical unit and an exposure apparatus, and a device manufacturing method, more particularly to a support unit that supports light transmissive optical members arranged on an optical path of illumination light, an optical unit that comprises a barrel equipped with the support unit, an exposure apparatus using the optical unit, and a device manufacturing method that uses the exposure apparatus for manufacturing devices.

2. Description of the Related Art

Conventionally, various exposure apparatus have been used in a lithographic process for producing electronic devices such as a semiconductor device (integrated circuit) and a liquid crystal display device. Ones mainly used in recent years are projection exposure apparatus such as a reduction projection exposure apparatus (a so-called stepper) based on a step-and-repeat method, which reduces and transfers a pattern of a mask (also called a reticle), which is formed by proportionally enlarging a pattern to be formed about four to five times, onto a substrate to be exposed such as a wafer via a projection optical system, and a scanning projection exposure apparatus (a so-called scanning stepper (also called a scanner)) based on a step-and-scan method, which is an improvement of the stepper.

With these projection exposure apparatus, exposure wavelengths have shifted to a shorter wavelength range in order to achieve high resolution to cope with finer circuit patterns that goes with higher density and higher integration of integrated circuits. Specifically, instead of the emission line (such as g-line and i-line) of a mercury lamp that has been mainly used conventionally, a KrF excimer laser having a wavelength of 248 nm is mainly used as an exposure wavelength at present, and the usage of an ArF excimer laser having a shorter wavelength of 193 nm is also entering a practical stage. Further, proposals are recently being made on projection exposure apparatus using an $F_2$ laser having a shorter wavelength of 157 nm or an $Ar_2$ laser having a shorter wavelength of 126 nm.

Such ultraviolet light having a wavelength of 190 nm or shorter is called vacuum ultraviolet light, and the vacuum ultraviolet light is strongly absorbed by almost all substances. For example, oxygen, water vapor, carbon dioxide, and almost all typical organic substances strongly absorb the vacuum ultraviolet light. Accordingly, in an exposure apparatus that uses vacuum ultraviolet light as its exposure light, the above-described light absorbing substances such as oxygen, water vapor, carbon dioxide, and organic substances need to be reduced or removed from the optical path where the exposure light passes in order to allow the exposure light to reach a wafer surface with sufficient illuminance. Generally, in order to perform manufacturing operation of electronic devices while securing sufficient productivity (throughput), the concentration of gas containing impurities such as the above-described light absorbing substances (hereinafter referred to as "absorptive gas") is removed from the space of the optical path to several ppm or less and the space of the optical path needs to be replaced with gas that absorbs only a small amount of vacuum ultraviolet light such as rare gas like nitrogen or helium (hereinafter referred to as "low absorptive gas").

Further, even when ultraviolet light having slightly longer wavelength (about 193 nm) than that of the vacuum ultraviolet is used, oxygen gas is preferably removed from the optical path since a small amount of the ultraviolet light is absorbed by oxygen gas.

As a replacement gas (purge gas) that is to be supplied into the optical system of the exposure apparatus, an illumination optical system, and the barrel (or housing) of a projection optical system, rare gas such as nitrogen ($N_2$) and helium (He) can be given, and of the gases, helium gas is extremely effective for suppressing an increase in temperature which occurs when lenses or the like that are components of an optical system absorb the exposure light, that is, from the viewpoint of cooling effect.

However, the refractive index of helium gas (about 1.000038) greatly differs from the refractive index of normal air or nitrogen (about 1.000319). Therefore, when nitrogen, air or the like enters a space filled with helium gas from the outside, the refractive index inside the helium gas space greatly changes, which causes aberration and desired optical performance cannot be realized.

In this case, a configuration is possible where each gas space is partitioned with the use of various optical members such as lenses arranged in the optical path space of the exposure apparatus. However, for adjustment of optical properties of the optical system, the position and the attitude of the optical members such as lenses need to be adjusted in most cases, and a clearance needs to be secured around the optical members with an extent in which the movement of the members is not interfered. However, because the clearance becomes a flow path for gas, it is difficult to completely prevent the gas entry described above.

Alternatively, to partition optical path spaces having different gas types, it is possible to install an optical member (hereinafter referred to as "partition wall optical member") that serves as a partition wall to stop the gas movement. However, since it is often the case where the partition wall optical member is arranged in an optically important position, the above-described clearance for adjustment needs to be provided in the same manner as the above-described optical members such as the lenses, and there is a risk that the gases will enter the space via the clearance.

To prevent the gases from entering the space, it is possible to completely block the gas movement by using sealing members such as an o-ring, which is often used in a vacuum unit, and various gaskets, without providing the above-described clearance for adjustment. However, when such a method is used, the partition wall optical member sandwiched in between the sealing members normally receives great pressure, and the partition wall optical member may be deformed significantly. Then, the wavefront of the exposure light having passed the deformed partition wall optical member is deformed significantly, which generates various optical aberrations (wavefront aberrations), which in turn keep the exposure apparatus from realizing a desired optical performance. This has been proven experimentally.

Furthermore, other than the sealing members used in the vacuum unit, a sealing method by a v-ring, an irregular o-ring, or the like, highly viscous fluid such as oil, or high-pressure fluid may also be considered. However, in these methods, it has been experimentally clarified that it is difficult to realize high-purity purge of the ppm level required by an exposure apparatus having the $F_2$ laser as a light source under the same atmospheric pressure environment as the optical path space of this type of exposure apparatus.

Furthermore, when fluid such as grease is used, it is possible to satisfy conflicting requirements such as high-purity purge of ppm level and suppressing the load (pressure) to the partition wall optical member. However, grease or the like usually emits gases such as organic substances. Such emission gases were also regarded as a problem in an exposure apparatus having the ArF excimer laser as a light source, where photochemical reaction between such gases and the exposure light occurs, causing them to deposit on the optical members and absorb the exposure light, generating a so-called "clouding". This makes it difficult to supply light having sufficient illuminance on a wafer surface, which makes this method a less than practical measure.

Specifically, in the case of holding the optical members that serve as the partition wall, at least the following four points must be simultaneously satisfied.

(1) Realize high-purity purge of ppm level and suppress the mixture of gases in two spaces partitioned by the partition wall optical member.
(2) Minimize the load (pressure) to the partition wall optical member as much as possible.
(3) Prevent gas emission that causes light absorption.
(4) Keep high installation reproducibility when exchanging optical members.

SUMMARY OF THE INVENTION

The present invention has been made under such circumstances, and has as its first object to provide a support unit that is capable of supporting optical members arranged on the optical path of an energy beam while their deformation is suppressed as much as possible and substantially separating the space on the optical path by the optical members.

It is a second object of the present invention to provide an optical unit capable of maintaining optical properties in a good condition for a long period of time.

It is a third object of the present invention to provide an exposure apparatus capable of maintaining exposure accuracy in a good condition for a long period of time.

It is a fourth object of the present invention to provide a device manufacturing method capable of improving the productivity of highly integrated electronic devices.

According to the first aspect of the present invention, there is provided a support unit that supports a light transmissive optical member arranged on an optical path of an energy beam, the unit comprising: a first wall that has a first opening that becomes a path of the energy beam, and a first opposing surface facing the vicinity of an outer periphery portion of one surface of the optical member via a predetermined first clearance; a second wall that has a second opening that becomes a path of the energy beam, and a second opposing surface facing the vicinity of an outer periphery portion of the other surface of the optical member via a predetermined second clearance; and a third wall that has a third opposing surface facing the entire peripheral surface of the optical member via a predetermined third clearance, wherein at least one of the first to third walls has a part of an exhaust path to exhaust gas inside the third clearance outside.

With this support unit, the energy beam can pass the second opening formed in the second wall, the optical member, and the first opening formed in the first wall. The first opposing surface of the first wall and the second opposing surface of the second wall face one surface and the other surface of the optical member, respectively, via the first and second clearance, and the third opposing surface of the third wall opposes the entire peripheral surface of the optical member via the third clearance. Further, a part of the exhaust path to forcibly exhaust the gas inside the third clearance outside is formed on at least one of the first to third walls.

In this case, since the optical member is supported by the support unit via the first to third clearance, unnecessary stress is not applied to the optical member and its deformation is suppressed as much as possible. Further, since the gas inside the third clearance, which communicates the first clearance on one surface of the optical member with the second clearance on the other surface of the optical member, is forcibly exhausted outside via the exhaust path, gas that is about to flow from the space on a surface side of the optical member into the space on the other surface side of the optical member via the first clearance and gas that is about to flow from the space on the other surface side of the optical member into the space on a surface side of the optical member via the second clearance are both forcibly exhausted outside via the exhaust path at a point when the gases reach the third clearance. Accordingly, mixing of gases between the space on one surface side of the optical member and the space on the other surface side of the optical member can be effectively suppressed.

Therefore, it is possible to substantially separate the space where the optical path of the energy beam is arranged, in a state where the deformation of the optical member is suppressed to the utmost.

In this case, the third opposing surface has at least one exhaust port that makes up a part of the exhaust path.

In this case, the third opposing surface has a groove that is formed on the entire circumference of the third opposing surface and has a predetermined depth making up a part of the exhaust path, and at least one of the exhaust port is formed inside the groove. The exhaust port is preferably arranged in plurals at a predetermined interval.

In the support unit of the present invention, one wall of the first wall and the second wall has at least one exhaust port that makes up a part of the exhaust path at a position excluding the area where the wall faces the optical member, and the other wall of the first wall and the second wall has at least one gas supply port that makes up a part of gas supply path for supplying gas into the third clearance.

In this case, the one wall has a first groove of a ring shape having a predetermined depth, which makes up a part of the exhaust path, at a position excluding the area where the wall faces the optical member, and at least one of the exhaust port can be formed inside the first groove, and the other wall has a second groove of a ring shape having a predetermined depth, which makes up a part of the gas supply path, at a position excluding the area where the wall faces the optical member, and at least one of the gas supply port can be formed inside the second groove. The exhaust port is made in the first groove in plurals, at a predetermined interval, and moreover, the gas supply port is preferably made in the second groove in plurals at a predetermined interval.

With the support unit of the present invention, in the case when at least one gas supply port, which makes up a part of the gas supply route to supply gas into the third clearance, is formed in the other wall, the unit can further comprise: a gas supply unit that supplies a predetermined gas into the third clearance via the gas supply path.

With the support unit of the present invention, the unit can further comprise: a gas exhaust unit that decompresses the inside of the exhaust path and exhausts gas inside the third clearance.

With the support unit of the present invention, the unit can further comprise: a film-shaped member that has a low degas level, which is provided at a section between at least one specific wall out of the first wall and the second wall and the optical member, in a state where the film-shaped member blocks a gas flow between the optical member and the specific wall.

With the support unit of the present invention, the first wall has at least three first projected portions that support the optical member in direct contact in at least three points.

In this case, the second wall has at least three second projected portions that respectively face each of the first projected portions and clamp the optical member with the opposing first projected portions.

With the support unit of the present invention, the unit can further comprise: a drive mechanism that drives the optical member in at least one of a first axis direction, which is a propagating direction of the energy beam, and a direction of inclination with respect to a plane orthogonal to the first axis.

With the support unit of the present invention, the first clearance and the second clearance can be a clearance whose dimension is substantially the same.

According to the second aspect of the present invention, there is provided an optical unit arranged on an optical path of an energy beam, the unit comprising: a barrel; and at least one support unit related to the invention, which is provided in a part of the barrel in a state where the optical member is positioned on the optical path of the energy beam.

With this optical unit, because the unit comprises: the barrel that forms the optical path of the energy beam therein; and at least one support unit of the present invention, which is provided in a part of the barrel in a state where the optical member is positioned on the optical path of the energy beam, the inside space and the outside space of the optical unit, or the two spaces inside the optical unit can be separated. Therefore, by filling predetermined gas in the space inside the optical unit, fluctuation of the refractive index of the predetermined gas and fluctuation of the optical properties of the optical unit can be suppressed. Further, since the optical member is arranged in a state where the first to third clearance is made between the member and the support unit, the deformation or the like of the optical member is suppressed as much as possible, and the optical properties of the optical unit can be maintained in a good condition also from this viewpoint. Furthermore, in the case of separating the two spaces inside the optical unit, the fluctuation of the refraction index of the gases in both spaces can be suppressed simultaneously even if the spaces are filled with different types of gas atmosphere.

In this case, the optical member can separate spaces of different gas atmosphere from each other.

With the optical unit of the present invention, the support unit can be severally provided on both the incident end portion and the exit end portion of the energy beam of the barrel.

In this case, the inside and the outside of the barrel can be gas spaces of different types.

With the optical unit of the present invention, the support unit can be disposed in between the incident end portion of the barrel and the exit end portion of the barrel.

According to the third aspect of the present invention, there is provided an exposure apparatus that exposes an object by an energy beam and forms a predetermined pattern on the object, the apparatus comprising: a light source that generates the energy beam; and the optical unit according to the present invention which is disposed on an optical path of the energy beam from the light source to the object.

With this apparatus, since optical unit whose optical properties is maintained in a good condition is arranged on the optical path reaching from the light source to the object, the fluctuation of refraction index and the transmission factor of space on the optical path are small even if the energy beam passes through the optical unit, by which highly accurate exposure can be realized for a long period of time.

Furthermore, in a lithographic process, a pattern can be formed on a photosensitive object with good accuracy by performing exposure using the exposure apparatus of the present invention, by which micro devices of higher integration can be manufactured with good yield.

Consequently, according to another aspect of the present invention, there is also provided a device manufacturing method using the exposure apparatus of the present invention.

BRIEF DESCRIPTION OF THE DRAWINGS

In the accompanying drawings.

DESCRIPTION OF THE EMBODIMENTS (First Embodiment)

Figure 1:
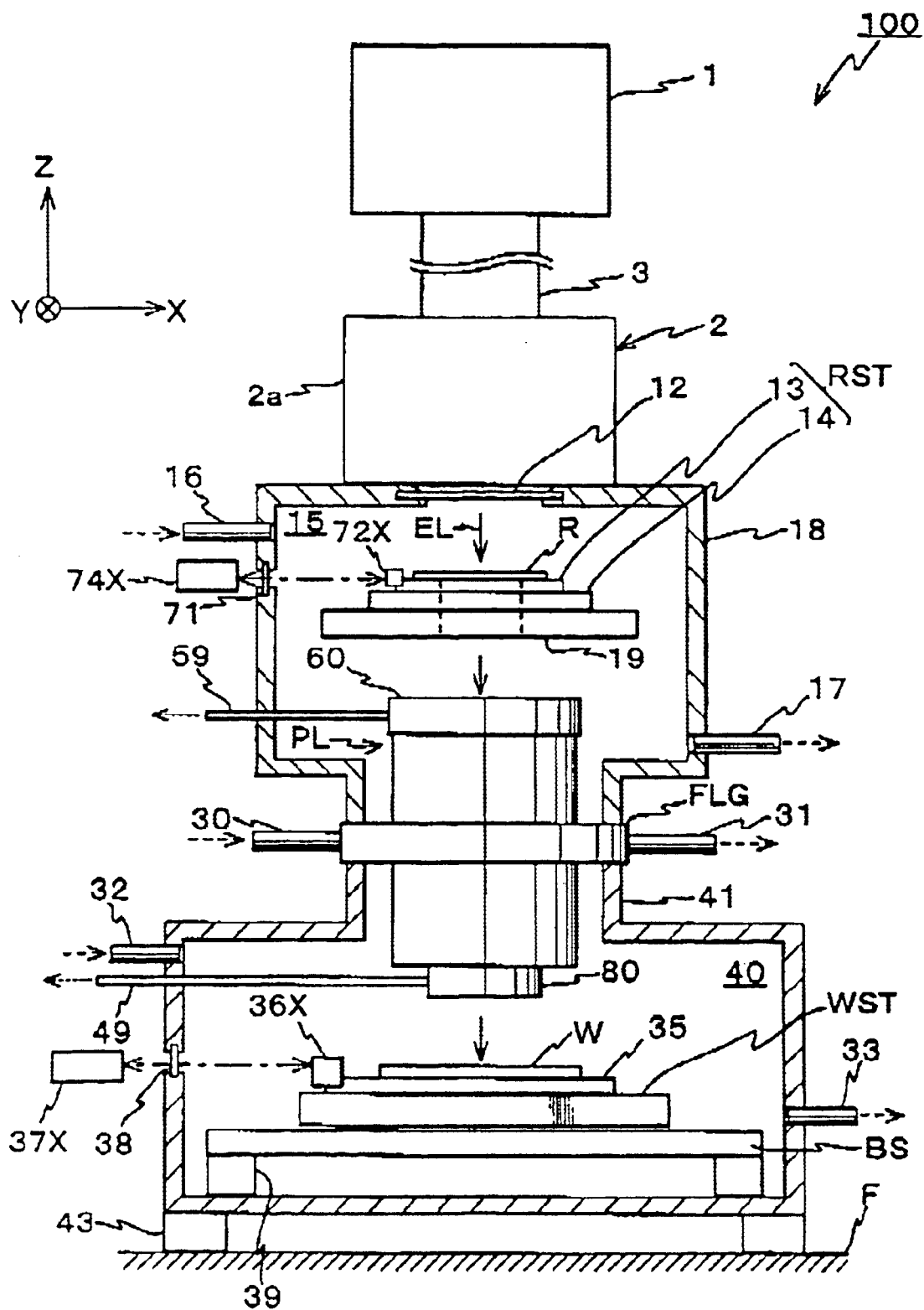
FIG. 1 is a view schematically showing the configuration of an exposure apparatus related to a first embodiment of the present invention.

A first embodiment of the present invention will be described below, referring to FIGS. 1 to 4. FIG. 1 schematically shows a configuration of an exposure apparatus 100 related to the first embodiment. Exposure apparatus 100 is a scanning projection exposure apparatus based on a step-and-scan method, that is, a so-called scanning stepper, which illuminates an illumination light for exposure (hereinafter referred to as "exposure light") EL serving as an energy beam onto a reticle R serving as a mask, and transfers a pattern formed on reticle R onto a wafer W serving as an object via a projection optical system PL serving as an optical unit.

Exposure apparatus 100 includes a light source 1 and an illumination unit 2 connecting to the light source 1 via a light transmission optical system 3, and also comprises: an illumination system irradiating exposure light EL onto reticle R; a reticle stage RST holding reticle R; projection optical system PL projecting exposure light EL emitted from reticle R onto wafer W; a wafer stage WST holding wafer W, and the like.

As light source 1, a light source that emits light in the vacuum ultraviolet region having a wavelength of about 120 nm to 190 nm, such as a fluorine laser ($F_2$ laser) having an output wavelength of 157 nm, for example, is used. It is possible, however, to use a light source emitting light in the near ultraviolet region as light source 1, such as an ArF excimer laser having an output wavelength of 193 nm and a KrF excimer laser having an output wavelength of 248 nm, in addition to other light sources emitting light in the vacuum ultraviolet region such as a krypton dimmer laser ($Kr_2$ laser) having an output wavelength of 146 nm or an argon dimmer laser ($Ar_2$ laser) having an output wavelength of 126 nm.

Light source 1 connects to one end of an illumination system housing 2a making up the illumination unit 2 via light transmission optical system (beam line) 3, which comprises an optical system called a beam matching unit for optical axis adjustment in a part of its system. Light source 1 is actually arranged in a service room whose degree of cleanness is lower than that of a clean room where illumination unit 2 and an exposure apparatus main body including projection optical system PL and the like are arranged, or in a utility space under the floor of the clean room.

Illumination unit 2 is configured, including: illumination system housing 2a isolating the inside from the outside; and an illumination optical system made up of an illuminance uniformity optical system including an optical integrator, a relay lens, a variable ND filter, a reticle blind, a dichroic mirror, and the like (all of them not shown) that are arranged inside illumination system housing 2a in a predetermined positional relationship. As the optical integrator, a fly-eye lens, a rod integrator (an internal reflection type integrator), diffractive optical element, or the like is used. The configuration of the illumination optical system is similar to the one disclosed in, for example, Japanese Patent Application Laid-open No. H06-349701 and its corresponding U.S. Pat. No. 5,534,970 or the like. Illumination unit 2 illuminates a slit shaped illumination area, which is set by the reticle blind on reticle R where a circuit pattern or the like is formed, with exposure light EL with substantially uniform illuminance. As long as the national laws in designated states or elected states, to which this international application is applied, permit, the disclosures cited in the above U.S. patent are fully incorporated herein by reference.

Meanwhile, when light whose wavelength is in the vacuum ultraviolet region is used as the exposure light, gases having strong absorption property to light in the wavelength region (hereinafter referred to as "absorptive gas" appropriately), such as oxygen, water vapor, or gases containing hydrocarbon need to be removed from its optical path. Therefore, in this embodiment, the inside of illumination system housing 2a is filled with specific gas having lower absorption property to light in the vacuum ultraviolet region when compared to air, which is nitrogen, rare gas such as helium, argon, neon and krypton, or mixed gas containing such gases (hereinafter referred to as "low absorptive gas" appropriately) in the vacuum ultraviolet region. As a result, the concentration of the absorptive gas inside illumination optical housing 2a is several ppm or less.

In this embodiment, light source 1 and the optical path inside light transmission optical system 3 are also filled with the low absorptive gas, similar to illumination system housing 2a.

Reticle stage RST holds reticle R, and is arranged in a reticle chamber 15. Reticle chamber 15 is covered with a partition wall 18, which joins illumination optical housing 2a and a flange portion FLG provided substantially at the center of the barrel of projection optical system PL in the height direction without a gap, and thus the gas inside the chamber is isolated from the outside. Partition wall 18 of reticle chamber 15 is made of a material such as stainless steel (SUS) that releases only a small amount of gas when degassed.

Following is the reason why the junction section (connecting section) between partition wall 18 of reticle chamber 15 and projection optical system PL is at flange portion FLG of the projection optical system PL. Specifically, flange portion FLG is a mount section to make a barrel supporting bed (mainframe) (not shown) hold projection optical system PL, and it is mechanically the strongest section in the structure of projection optical system PL. Therefore, even if stress of any kind is applied to projection optical system PL due to the junction with partition wall 18, the deformation of projection optical system PL can be suppressed to the minimum, which makes flange portion FLG an excellent joining section. It is also possible to use metal bellows or a softer film-shaped member to further reduce vibration caused by the movement of reticle stage RST traveling to flange portion FLG via partition wall 18.

Reticle chamber 15 is supported by a support member (not shown). Further, a rectangular opening slightly smaller than reticle R is formed on the ceiling portion of partition wall 18 of reticle chamber 15, and a light transmittance window 12 is arranged in the opening portion so as to separate the space inside illumination optical housing 2a and that of reticle chamber 15 where reticle R to be exposed is arranged. Because light transmittance window 12 is arranged on the optical path of exposure light EL irradiated from illumination unit 2 onto reticle R, it is made of a fluoride crystal material such as fluorite that has high transmittance to vacuum ultraviolet light serving as the exposure light.

Reticle stage RST is configured so as to drive reticle R linearly with large strokes in the X-axis direction on a reticle base supporting bed 19, and also to drive the reticle finely in the Y-axis direction and the θz direction (rotational direction around the Z-axis).

More specifically, reticle stage RST is configured including a reticle scanning stage 14, which is driven in the X-axis direction with predetermined strokes on reticle base supporting bed 19 by a reticle drive system (not shown) that includes a linear motor or the like, and a reticle holder 13 that holds reticle R mounted on reticle scanning stage 14 by suction. Reticle holder 13 is configured finely drivable (including rotation) within the XY plane by a voice coil motor or the like that constitutes the reticle drive system.

Inside reticle chamber 15, a flow of low absorptive gas that absorbs only a small amount of exposure light EL ($F_2$ laser beam) such as nitrogen in this case, is created at all times. This is because in an exposure apparatus that uses exposure wavelength in the vacuum ultraviolet region, the vicinity of reticle R also needs to be replaced with low absorptive gas so as to prevent absorptive gas such as oxygen from absorbing the exposure light. Thus, the concentration of absorptive gas in reticle chamber 15 is also several ppm or less.

More specifically, one end of a gas supply pipeline 16 and one end of an exhaust pipeline 17 are severally connected to partition wall 18 of reticle chamber 15, as shown in FIG. 1. Further, the other end of gas supply pipeline 16 is connected to a nitrogen gas supply unit (not shown). Furthermore, the other end of exhaust pipeline 17 is connected to a gas collection unit (not shown). Then, high-purity nitrogen gas is constantly supplied from the nitrogen gas supply unit into reticle chamber 15 via gas supply pipeline 16, and gas inside reticle chamber 15 is exhausted to the gas collection unit via exhaust pipeline 17. Nitrogen gas flows constantly into reticle chamber 15 in this manner, and the concentration of the absorptive gases (oxygen, water vapor, organic substances, or the like) other than the nitrogen gas in reticle chamber 15 is maintained to several ppm or less.

In addition, although drawings are omitted, a support member inserted from the outside via the opening formed on partition wall 18 horizontally supports reticle base supporting bed 19. Furthermore, in order to reduce vibration that travels to projection optical system PL via the support member and partition wall 18, generated in reticle base supporting bed 19 due to the movement of reticle stage RST, and also to prevent gas leakage from the opening formed in partition wall 18, freely expandable metal bellows are provided around the opening on the outer surface of partition wall 18, connecting the portion around the opening of partition wall 18 and the support member. A softer film-shaped member can also be used, instead of the metal bellows.

A light transmittance window 71 is provided on the side wall in the −X side of partition wall 18 of reticle chamber 15. Although not shown, a light transmittance window is also provided on the side wall in the +Y side (in depth of the page surface in FIG. 1) of partition wall 18. These light transmittance windows are configured attaching a light transmissive member for closing the windows, which is normal optical glass in this embodiment, to the windows (openings) formed in partition wall 18. In this case, in order to prevent gas leakage from the attachment portion of the light transmissive member making up the light transmittance window 71, metal sealing such as indium and copper or sealing by fluorocarbon resin is applied to the attachment portion. As the above fluorocarbon resin, fluorocarbon resin degassed by undergoing heat treatment for two hours at the temperature of 80° C. is preferably used.

On the end portion of the −X side of reticle holder 13, an X movable mirror 72X made up of a planar mirror is provided extending in the Y-axis direction. Length measuring beams from an X-axis laser interferometer 74X arranged outside reticle chamber 15 is projected on X movable mirror 72X almost at a right angle via light transmittance window 71. The reflection beam reflected off X movable mirror 72X is received by a detector inside X-axis laser interferometer 74X via light transmittance window 71, and detects the position of movable mirror 72X, that is, the X position of reticle R, using the position of a reference mirror arranged inside X-axis laser interferometer 74X as a reference.

Similarly, although omitted in the drawings, on the end portion of the +Y side of reticle holder 13, a Y movable mirror made up of a planar mirror is provided extending in the X-axis direction. Then, in a manner similar to the above description, a Y-axis laser interferometer (not shown) detects the position of the Y movable mirror, that is, the Y position of reticle R via the Y movable mirror. Detection values (measurement values) of the above two laser interferometers are supplied to a control unit (not shown), and the control unit controls the position of reticle stage RST based on the detection values of these laser interferometers.

As is described, in this embodiment, because the laser interferometer, that is, the laser light source, optical members such as a prism, the detector, and the like are arranged outside reticle chamber 15, there are no adverse effects on exposure even if a small amount of absorptive gas is generated from the detector or the like making up the laser interferometers.

As projection optical system PL, for example, a system is used, which is a double telecentric reduction optical system as well as a dioptric system consisting of a plurality of lens elements (formed of fluorite or fluoride crystal such as lithium fluoride) having a common optical axis in the Z-axis direction. Projection optical system PL has a projection magnification $\beta$ of, for example, ¼ or ⅕. As is described above, when exposure light EL from illumination unit 2 illuminates reticle R, projection optical system PL reduces and projects the circuit pattern formed on reticle R onto a part of shot areas on wafer W, transferring and forming a reduced image (partial image) of the circuit pattern on wafer W.

Further, in this embodiment where light source 1 is a vacuum ultraviolet light source such as $F_2$ laser having the output wavelength of 157 nm, gas of the optical path in projection optical system PL needs to be replaced with rare gas such as helium or nitrogen gas (low absorptive gas), which absorbs only a small amount of vacuum ultraviolet light. Furthermore, in an exposure apparatus having the vacuum ultraviolet light source, the material of lenses of projection optical system PL is limited to a crystal material such as fluorite having a large thermal expansion coefficient. Accordingly, because the increase in temperature which occurs when the lenses absorb the exposure light EL greatly affects the image forming characteristics or the like of the lenses, this embodiment employs helium gas having a large cooling effect out of the above-described low absorptive gases.

However, helium gas has a large refraction index difference with nitrogen or air. Even if only a small amount of nitrogen gas in reticle chamber 15 and a wafer chamber 40 (described later) enters the barrel of projection optical system PL filled with helium gas, the refraction index of the helium gas inside the barrel fluctuates and greatly deteriorates the image forming characteristics of projection optical system PL, thus degrading the performance of the apparatus. Therefore, in this embodiment, in the upper end portion (end portion on the +Z side) and the lower end portion (end portion on the −Z side) of projection optical system PL, a mechanism is employed where helium gas inside the barrel of projection optical system PL is almost completely isolated from nitrogen gas on the outside. The configuration of projection optical system PL including the mechanism for isolating helium gas from nitrogen gas will be described later in detail.

Wafer stage WST is arranged inside wafer chamber 40. Wafer chamber 40 is covered with a partition wall 41 joined with the barrel of projection optical system PL without a gap, and the gas inside the barrel is isolated from the outside. Partition wall 41 of wafer chamber 40 is formed of a material such as stainless steel (SUS) that releases only a small amount of gas when degassed.

The contact portion between partition wall 41 of wafer chamber 40 and projection optical system PL is at flange portion FLG of projection optical system PL, similar to partition wall 18 of reticle chamber 15. This is for the same reasons as to why partition wall 18 of reticle chamber 15 is connected to flange portion FLG.

Inside wafer chamber 40, a base BS is horizontally supported via a plurality of vibration isolation units 39. In addition, partition wall 41 of wafer chamber 40 is supported on a floor surface F by a plurality of vibration isolation units 43. Vibration isolation units 43 insulate fine vibration from the floor at a micro G level, while vibration isolation units 39 suppress vibration of base BS traveling through partition wall 41 to projection optical system PL that occurs due to the movement of wafer stage WST.

Wafer stage WST can be driven freely in the XY two dimensional directions along the upper surface of base BS by a wafer stage drive system (not shown) made up of a linear motor or the like, for example. Wafer W is held on wafer stage WST via a wafer holder 35 by suction.

In the exposure apparatus using exposure wavelength in the vacuum ultraviolet region as in this embodiment, the optical path from projection optical system PL to wafer W also needs to be replaced with nitrogen or rare gas in order to prevent the exposure light from being absorbed by absorptive gases such as oxygen.

Therefore, as is shown in FIG. 1, one end of a gas supply pipeline 32 and one end of an exhaust pipeline 33 severally connect to partition wall 41 of wafer chamber 40. The other end of gas supply pipeline 32 connects to a nitrogen gas supply unit (not shown). Further, the other end of exhaust pipeline 33 connects to a gas collection unit (not shown). Then, nitrogen gas of a high-purity level is supplied at all times from the nitrogen gas supply unit into wafer chamber 40 via gas supply pipeline 32, and the gas inside wafer chamber 40 is exhausted to the gas collection unit via exhaust pipeline 33. The nitrogen gas flow is made at all times inside wafer chamber 40 in this manner, and the concentration of the absorptive gases other than the nitrogen gas in wafer chamber 40 (such as oxygen, water vapor, and organic substances) is maintained to several ppm or less.

It is also possible, for example, to employ a configuration in which the other ends of gas supply pipeline 32 and exhaust pipeline 33 respectively connect to a discharge port and a return port of the nitrogen gas supply unit incorporating a gas refining unit, and nitrogen gas is circulated in a circulation route that includes the nitrogen gas supply unit and the inside of wafer chamber 40. In this case, for example, sensors such as a pressure sensor and absorptive gas concentration sensor may be provided in wafer chamber 40, and based on the measurement values of the sensors, the operation of a pump built in the nitrogen gas supply unit can be appropriately controlled via a control unit (not shown). A similar configuration can be employed in the above-described reticle chamber 15.

A light transmittance window 38 is provided on the side wall in the −X side of partition wall 41 of wafer chamber 40. Similarly, although drawings are omitted, the light transmittance window is also provided on the side wall in the +Y side (in depth of the page surface in FIG. 1) of partition wall 41. These light transmittance windows are configured attaching a light transmissive member for closing the windows, which is normal optical glass in this embodiment, to the windows (openings) formed in partition wall 41. In this case, in order to prevent gas leakage from the attachment portion of the light transmissive member making up the light transmittance window 38, metal sealing such as indium and copper or sealing by fluorocarbon resin is applied to the attachment portion. As the above fluorocarbon resin, fluorocarbon resin degassed by undergoing heat treatment for two hours at the temperature of 80° C. is preferably used.

On the end portion of the −X side of the wafer holder 35, an X movable mirror 36X made up of a planar mirror is provided extending in the Y-axis direction. Length measuring beams from an X-axis laser interferometer 37X arranged outside wafer chamber 40 is projected on the X movable mirror 36X almost at a right angle via light transmittance window 38. The reflection beam reflected off X movable mirror 72X is received by a detector inside X-axis laser interferometer 37X via light transmittance window 38, and detects the position of movable mirror 36X, that is, the X position of wafer W, using the position of a reference mirror arranged inside X-axis laser interferometer 37X as a reference.

Similarly, although omitted in the drawings, on the end portion of the +Y side of wafer holder 35, a Y movable mirror made up of a planar mirror is provided extending in the x-axis direction. Then, in a manner similar to the above description, a Y-axis laser interferometer (not shown) 37Y detects the position of the Y movable mirror, that is, the Y position of wafer W via the Y movable mirror. Detection values (measurement values) of the above two laser interferometers are supplied to the control unit (not shown), and the control unit controls the position of the wafer stage WST via a wafer drive system while monitoring the detection values of these laser interferometers.

As is described, in this embodiment, because the laser interferometer, that is, the laser light source, optical members such as a prism, the detector and the like are arranged outside wafer chamber 40, there are no adverse effects on exposure even if a small amount of absorptive gas is generated from the detector or the like.

Next, the configuration of projection optical system PL will be described in detail, referring to FIG. 2.

Figure 2:
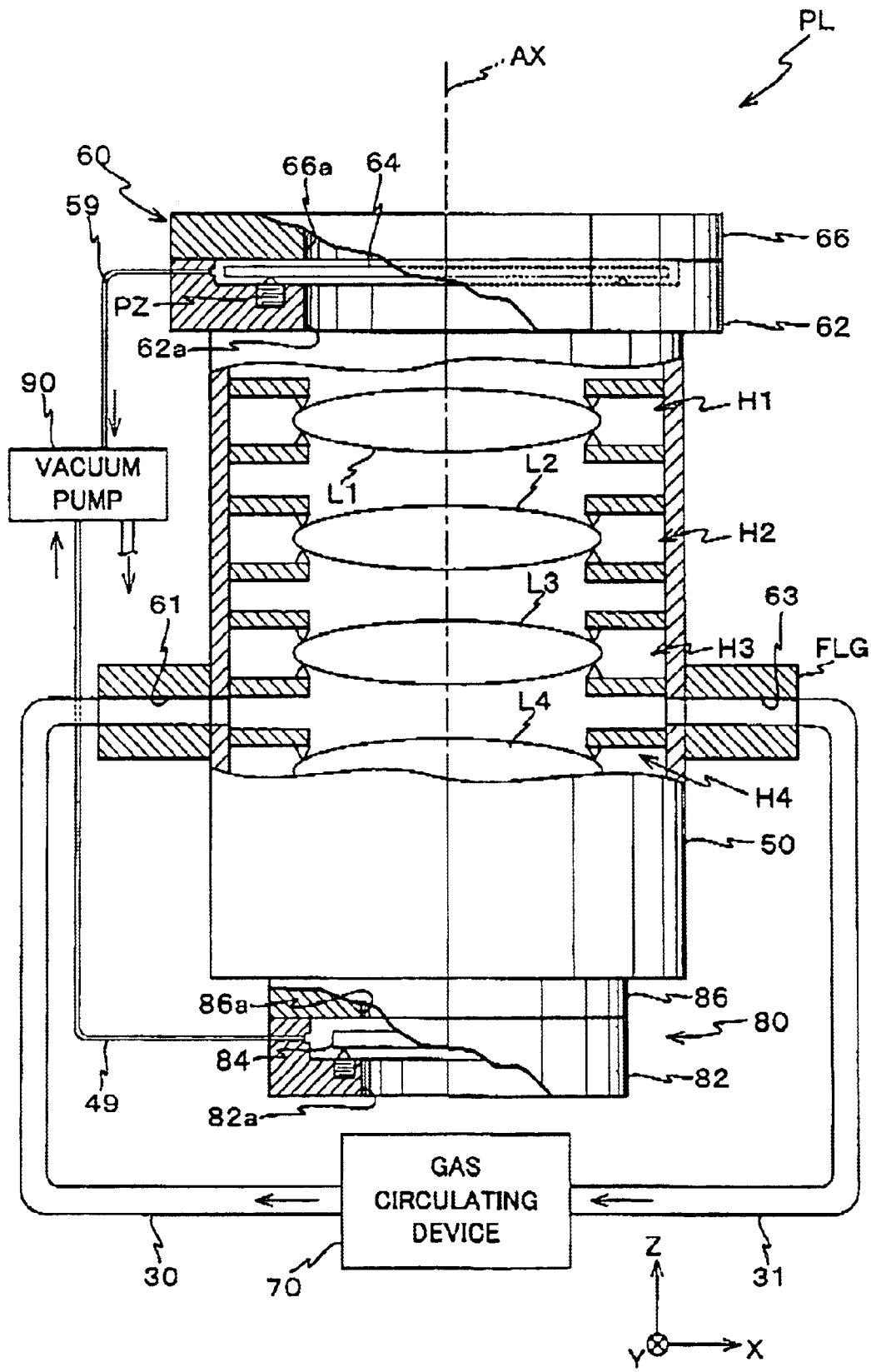
FIG. 2 is a view schematically showing a gas piping system of a projection optical system in FIG. 1.

FIG. 2 schematically shows the side view of projection optical system PL along with the gas piping system, with a part of its barrel broken.

As is shown in FIG. 2, projection optical system PL comprises a barrel 50, and a plurality of lenses L1, L2, L3, L4, and so on that are arranged in barrel 50 at a predetermined interval.

On the inner periphery surface of barrel 50, lens holding mechanisms H1, H2, H3, H4, and so on that hold the periphery portion of each lens in point contact in a vertical direction are arranged vertically at a predetermined interval. The lens holding mechanisms are severally arranged at plural positions on the inner periphery surface of barrel 50 at a predetermined interval.

In flange portion FLG of projection optical system PL, which is provided slightly below the center of barrel 50 in the height direction, a gas supply path 61 and a gas exhaust path 63 are severally formed in a state communicating the inside with the outside of projection optical system PL, as is shown in FIG. 2. One end of gas supply pipeline 30 and one end of exhaust pipeline 31 connect to gas supply path 61 and gas exhaust path 63, respectively. The other end of gas supply pipeline 30 connects to one end of a gas circulating device 70 that supplies helium gas into barrel 50 and exhausts the gases inside barrel 50, and the other end of exhaust pipeline 31 connects to the other end of gas circulating device 70.

The gas circulating device 70 replaces the gas inside barrel 50 at all times with high-purity helium gas, by making a circulation flow of helium gas into barrel 50 of projection optical system PL via gas supply pipeline 30 and exhaust pipeline 31 at all times. This allows the concentration absorptive gas inside barrel 50 of projection optical system PL to be maintained at several ppm or less at all times. Further, gas circulating device 70 incorporates the gas refining unit (not shown), which operates so that the concentration of the absorptive gas inside barrel 50 can be maintained at several ppm or less even when helium gas is circulated and used for a long period of time in the circulation route including gas circulating device 70 and the inside of barrel 50 of projection optical system PL. Sensors such as a pressure sensor and a concentration sensor (such as an oxygen concentration sensor and a water vapor concentration sensor, for example) may be provided inside barrel 50, and based on the measurement values of the sensors, the start/stop operation of the pump built in gas circulating device 70 may be appropriately controlled via the control unit (not shown).

The helium gas supplied into barrel 50 of projection optical system PL does not necessarily have to be circulated upon usage. Instead, a configuration similar to the above-described reticle chamber 15 and wafer chamber 40 may be employed where high-purity helium gas is supplied from a high-purity helium gas supply unit into barrel 50 via gas supply pipeline 30 and the gas inside barrel 50 is exhausted to the gas collection unit (not shown).

The reason for performing gas supply/exhaustion via flange portion FLG is because when flange portion FLG whose mechanical strength is high is used, the influence of vibration traveling to projection optical system PL via gas supply pipeline 30 and exhaust pipeline 30 of helium gas connecting to flange portion FLG can be suppressed to the minimum.

At the upper end portion of barrel 50, a first isolating mechanism 60 is provided for substantially blocking gas flowing from barrel 50 of projection optical system PL to reticle chamber 15 (refer to FIG. 1) and gas flowing into barrel 50 of projection optical system PL from reticle chamber 15, that is, substantially keeps the nitrogen gas in reticle chamber 15 and helium gas in barrel 50 from mixing, as is shown in FIG. 2.

As is shown in FIG. 2, the first isolating mechanism 60 comprises a first holding member 62 integrally provided at the upper end portion of barrel 50, and a second holding member 66 mounted on and integrated with the first holding member 62.

Figure 3:
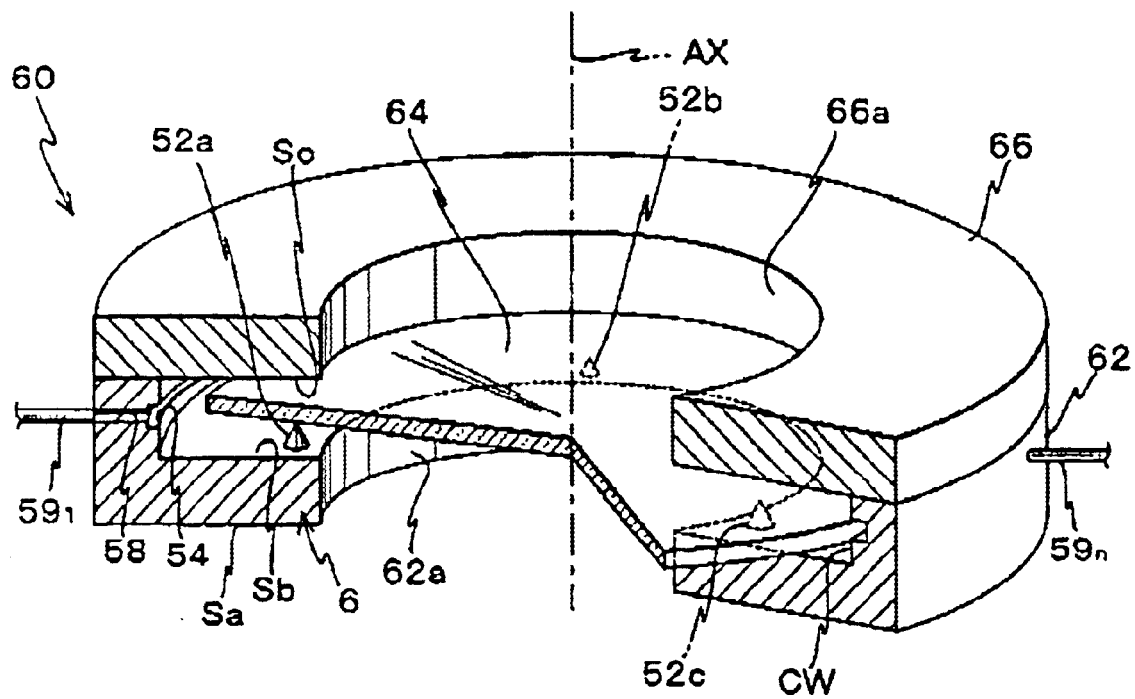
FIG. 3 is a partially broken perspective view showing the first isolating mechanism related to the first embodiment.
Figure 4:
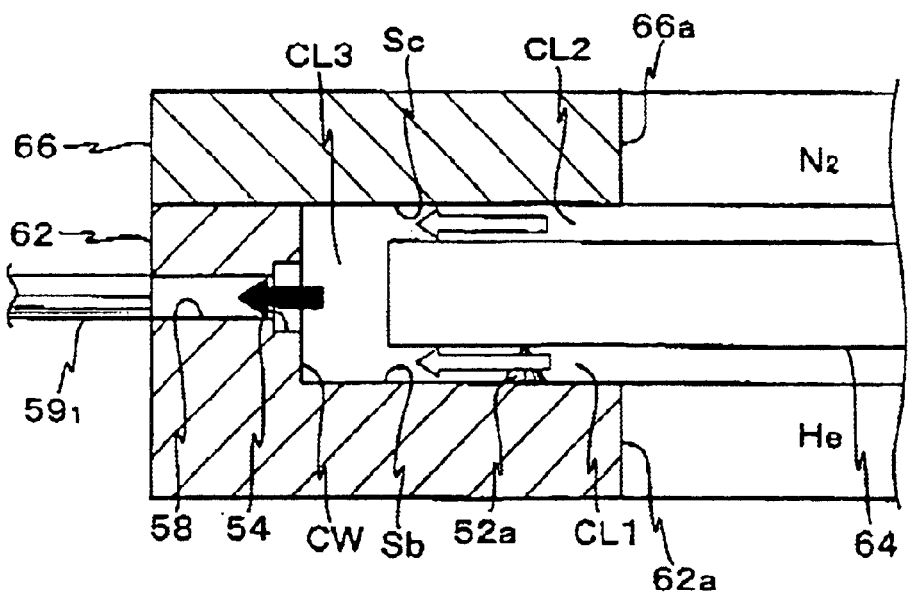
FIG. 4 is a view for explaining the function of the first isolating mechanism related to the first embodiment.

More specifically, as is shown in FIG. 3, which is a perspective view showing the first isolating mechanism 60 in a partially broken state, the first holding member 62 is formed of a ring-shaped member whose sectional shape resembles the letter L and has a penetrating hole 62a serving as a first circular opening as the optical path for exposure light EL formed at the center (that is, the first holding member 62 has a shape where the center of a columnar-shaped member having a predetermined height is dug by a predetermined depth and a penetrating circular opening is formed in the inner bottom surface) A bottom surface Sa of the first holding member 62 (surface fixed to the upper end surface of barrel 50) is a flat surface, and on the opposite side (upper surface side) the area excluding the ring shaped area of a predetermined width in the outer periphery section is a flat surface Sb where the degree of flatness is extremely high. On flat surface Sb, three projected portions 52a, 52b and 52c are provided spaced apart at substantially an equal angle on the same circumference. Projected portions 52a to 52c are projected upward from flat surface Sb at a height of about 10 μm, for example. Further, flat surface Sb is a surface parallel with bottom surface Sa.

The ring shaped area of a predetermined width is a circumference wall CW raised upward from flat surface Sb by a predetermined height. The upper surface of circumference wall CW is a surface parallel with bottom surface Sa.

On projected portions 52a to 52c of the first holding member 62, a partition wall parallel plate 64 serving as an optical member made up of a circular parallel flat plate is mounted substantially concentric with penetrating hole 62a. In this case, projected portions 52a to 52c support partition wall parallel plate 64 at three points in direct contact at the position of several cm from the outer periphery of the bottom surface of the plate. Accordingly, as is clear from FIG. 3 as well, flat surface Sb and the band-shaped area several cm from the outer periphery of partition wall parallel plate 64 oppose each other via a first clearance of about 10 μm (refer to reference code CL1 in FIG. 4). Specifically, flat surface Sb constitutes a first opposing surface that opposes partition wall parallel plate 64 via the first clearance CL1, and a flat plate-shaped portion having a ring shape in a planar view where the first opposing surface is provided constitutes a first wall 6. Hereinafter, flat surface Sb will be referred to as the first opposing surface Sb.

In this case, the portion of the first holding member 62 in contact with the lower surface of partition wall parallel plate 64 is limited to the tip portion of projected portions 52a to 52c, so the lower surface of partition wall parallel plate 64 is held on a plane set by the three tip portions. Therefore, with projected portions 52a to 52c, the lower surface of partition wall parallel plate 64 is not deformed in any shape like when partition wall parallel plate 64 is supported in direct contact by the first opposing surface Sb of the first holding member 62 where the surface shape of the first opposing surface Sb has processing errors, and the degree of flatness of partition wall parallel plate 64 is maintained. Accordingly, partition wall parallel plate 64 is free from unnecessary stress, and the optical properties such as the refraction index can be maintained.

As is shown in FIG. 3, the second holding member 66 is formed of a ring-shaped plate member where a penetrating hole 66a, serving as a second opening for the optical path of exposure light EL, is formed at the center. The outer diameter of second holding member 66 is in the same dimension as that of the above first holding member 62, and a band-shaped portion in the outer periphery portion of the second holding member 66 is fixed to the top end surface of the circumference wall of the first holding member 62 by adhesive agent or the like. Furthermore, the inner diameter of the second holding member 66 (the diameter of the penetrating hole 66a) is substantially the same as the inner diameter of the first holding member 62 (the diameter of the penetrating hole 62a).

A lower surface Sc of the second holding member 66 opposes the upper surface of partition wall parallel plate 64 via the second clearance, for example, of about 10 μm (refer to reference code CL2 in FIG. 4), similar to the case of the above-described first opposing surface Sb. Specifically, lower surface Sc of the second holding member 66 constitutes a second opposing surface, and the second holding member 66 on which the second opposing surface is provided constitutes a second wall. The reason why the second clearance CL2 was set to approximately the same clearance as the first clearance CL1 will be described later.

Partition wall parallel plate 64 is formed of fluorite or fluoride crystal such as lithium fluoride, similar to the lenses L1 to L4 described above. Further, the external shape of partition wall parallel plate 64 is larger than the diameter of penetrating hole 62*a* formed at the center of the first holding member 62 by about several cm, and smaller than the inner diameter of the circumference wall CW of the first holding member 62 by approximately a few tens of $\mu$m. Therefore, the outer periphery surface of partition wall parallel plate 64 and the inner periphery surface of circumference wall CW of the first holding member 62 oppose each other via a predetermined third clearance (refer to reference code CL3 in FIG. 4). Specifically, the inner periphery surface of the circumference wall CW constitutes a third opposing surface, and the circumference wall on which the third opposing surface is provided constitutes a third wall.

As is shown in FIG. 2 (only one piezoelectric element PZ is shown in FIG. 2), inside the first holding member 62 below the projected portions 52*a* to 52*c*, three drive elements are buried that finely drive projected portions 52*a* to 52*c* in the Z-axis direction independently, such as, for example, piezoelectric elements PZ. By expanding and contracting the three piezoelectric elements PZ, the peripheral three points of partition wall parallel plate 64 can be independently moved in the optical axis AX direction of the projection optical system PL. Specifically, partition wall parallel plate 64 can be moved parallelly along the optical axis AX corresponding to expansion/contraction displacement quantity of the three piezoelectric elements PZ, and the plate also can be tilted arbitrarily with respect to a plane perpendicular to the optical axis AX. In this case, a control unit (not shown) controls the voltage applied to each piezoelectric element PZ via a voltage application circuit (not shown), by which the displacement quantity of the drive elements is controlled. In this embodiment, the above-described piezoelectric elements and the voltage application circuit constitute a drive mechanism that drives partition wall parallel plate 64 serving as an optical member.

On the inner periphery surface of circumference wall CW of the first holding member 62, that is, on the third opposing surface, an exhaust groove 54 having a predetermined depth (for example, about several mm) is formed on the entire circumference, as is shown in FIG. 3. On the inner bottom surface of exhaust groove 54, an exhaust path 58, which serves as at least one exhaust port penetrating through to the outer surface of the circumference wall, is formed, and exhaust path 58 is connected to one end of each of the exhaust branch pipelines $59_1$, $59_2$, ... $59_n$ (only exhaust branch pipelines $59_1$, $59_n$ are shown in FIG. 3). The other end of each of these exhaust branch pipelines $59_1$, $59_2$, ... $59_n$ is connected to one end of an exhaust main pipeline 59 (refer to FIGS. 1 and 2). Exhaust paths 58 is preferably formed in plural numbers at a predetermined space.

As shown in FIG. 2, the other end of exhaust main pipeline 59 connects to a vacuum pump 90 serving as a gas exhaust unit. Vacuum pump 90 connects to a gas storage chamber (not shown), and exhausts the exhausted gas flowing into the pump via exhaust main pipeline 59 to the gas storage chamber (not shown).

In this embodiment, when vacuum pump 90 is activated, negative pressure occurs inside exhaust path 58 via exhaust main pipeline 59 and exhaust branch pipelines ($59_1$ to $59_n$), the inside of the exhaust groove 54 also becomes a negative pressure state, and gas in the third clearance surrounding the side surface of partition wall parallel plate 64 is forcibly exhausted outside via parts such as exhaust groove 54, a plurality of the exhaust paths 58, exhaust branch pipelines ($59_1$ to $59_n$), exhaust main pipeline 59, and the like. Accordingly, as is shown by the white arrows in FIG. 4, even when gas (nitrogen gas) in the space above partition wall parallel plate 64 and gas (helium gas) in the space below the plate try to flow into the other space via the above-described first and second clearance CL1, CL2 of about 10 $\mu$m between partition wall parallel plate 64 and the first and second holding members 62, 66, the gases are forcibly exhausted outside via exhaust groove 54, a plurality of the exhaust paths 58, and the like as is shown by the bold arrow in FIG. 4 at the point when the gases reach the third clearance. With this configuration, helium gas rarely flows into the space filled with nitrogen gas and nitrogen gas rarely flows into the space filled with helium gas.

Because the inside of the third clearance on the side surface of partition wall parallel plate 64 is decompressed due to the forcible exhaustion, pressure gradient occurs in the first clearance CL1 between the first holding member 62 and partition wall parallel plate 64 and in the second clearance CL2 between the second holding member 66 and partition wall parallel plate 64. However, since partition wall parallel plate 64 is a parallel flat plate, its upper surface and lower surface are in the same shape, and since both the first clearance CL1 below the plate and the second clearance CL2 above the plate are clearance of about 10 $\mu$m, the level of pressure gradient in the clearance above and below the partition wall parallel plate 64 can be about the same. Specifically, taking this point in consideration, the second clearance CL2 is set at the same clearance level as the first clearance CL1 in this embodiment. As a result, surface deformation quantity of the partition wall parallel plate 64 can be reduced, by which the optical properties such as refraction index of partition wall parallel plate 64 can be maintained for a long period of time.

In addition, because both the first and second clearances CL1, CL2 have narrow gaps of about 10 $\mu$m, the amount of helium gas and nitrogen gas discharged by vacuum pump 90 is extremely small. In this case, the increase in consumption amount of helium gas and nitrogen gas caused by the discharge by the above-described vacuum pump is very small, and cost increase accompanied by the increase is negligible.

Furthermore, when the space on the side wall of the partition wall parallel plate 64 is decompressed as is described above, stress applied to the upper and lower surfaces of partition wall parallel plate 64 can be suppressed significantly smaller comparing to the case where the spaces above and below the upper and lower surfaces of partition wall parallel plate 64 are decompressed. Therefore, not only the surface deformation quantity of partition wall parallel plate 64 can be reduced, but also surface deformation (bend) can be corrected because tensile stress is applied to the side surface of the partition wall parallel plate 64, which exerts more favorable effects.

In this case, when negative pressure occurs inside the exhaust path 58 via the exhaust main pipeline 59 and the exhaust branch pipelines ($59_1$ to $59_n$) due to the operation of vacuum pump 90, the number of the above-described exhaust path 58 and exhaust branch pipelines $59_1$ to $59_n$ is preferably set around the number where gas inside the third clearance can be forcibly exhausted evenly along the entire circumference of the circumference wall of partition wall parallel plate 64.

As is shown in FIG. 2, the second isolating mechanism 80 is provided on the lower end portion of barrel 50 of projection optical system PL. The second isolating mechanism 80 has the same configuration as the first isolating mechanism 60. Specifically, the second isolating mechanism 80 comprises: a third holding member 82 having the same shape as the first holding member 62; a partition wall parallel plate 84 supported by direct contact with three projected portions from below, which are provided on the upper surface of the third holding member 82, while maintaining the clearance of about 10 μm, for example, with respect to the third holding member 82; and a fourth holding member 86 fixed to the third holding member 82 while maintaining the clearance of about 10 μm, for example, with respect to the upper surface of the partition wall parallel plate 84. The projected portions can be individually driven by piezoelectric elements PZ similar to the projected portions 52a to 52c of the first isolating mechanism 60.

On the entire circumference of the inner periphery surface of the circumference wall portion of the third holding member 82, an exhaust groove having a predetermined depth is formed, and in the exhaust groove, a plurality of exhaust paths are formed. To the other end of each of the exhaust paths, one end of exhaust branch pipelines branched from the exhaust main pipeline 49 is connected to the other end of each of the exhaust paths. In FIGS. 1 and 2, plurality of the exhaust branch pipelines and the exhaust main pipeline are representatively shown as exhaust main pipeline 49.

In the second isolating mechanism 80 as well, when vacuum pump 90 decompresses the inside of the exhaust paths and the exhaust groove via exhaust main pipeline 49 and the exhaust branch pipelines in the same manner as the above-described first isolating mechanism 60, gas in the clearance near the outer periphery surface of partition wall parallel plate 84 is forcibly exhausted outside via the exhaust groove, the exhaust paths, the exhaust branch pipelines, and exhaust main pipeline 49. This makes it possible to prevent almost completely the intrusion of gases from one space of the upper and lower spaces of partition wall parallel plate 84 to the other space via the upper and lower clearance of partition wall parallel plate 84, that is, to prevent gas inside barrel 50 of projection optical system PL from flowing into wafer chamber 40 and to prevent gas inside wafer chamber 40 from flowing into barrel 50 of the projection optical system PL.

Further, in the second isolating mechanism 80 as well, because a supporting force to cause deformation in the partition wall parallel plate 84 is not applied the deformation of the partition wall parallel plate 84 and the fluctuation of its optical characteristic can be suppressed for a long period of time.

Next, exposure operation in the exposure apparatus 100 configured as is described above will be briefly described.

First, after various exposure conditions are set, predetermined preparatory operations such as reticle alignment using a reticle alignment system (not shown), an off-axis alignment sensor (not shown), or the like, and baseline measurement of the alignment sensor are performed under the control of the control unit (not shown). Then, under the control of the control unit, fine alignment (such as EGA: Enhanced Global Alignment) on wafer W using the alignment sensor is completed, and the arrangement coordinates of a plurality of shot areas are obtained.

When the preparatory operations for the exposure of wafer W ends in this manner, the control unit (not shown) moves wafer stage WST to an acceleration starting position for exposure (starting position for scanning exposure) on the first shot area via the wafer drive system based on an alignment result, while monitoring the measurement values of X-axis laser interferometer 37X and Y-axis laser interferometer 37Y on the wafer side.

Then, the control unit starts scanning reticle stage RST and wafer stage WST in the X-axis direction via the reticle drive system and the wafer drive system. When both of the stages RST, WST reach a target scanning velocity, exposure light EL begins illuminating the pattern area of reticle R, and scanning exposure begins.

Then, different areas of the pattern area of reticle R are sequentially illuminated with the ultraviolet pulse light, and when illumination on the entire pattern area has been completed, scanning exposure on the first shot area on wafer W ends. Thus, the circuit pattern of reticle R is reduced and transferred on the resist layer of the first shot area via projection optical system PL. When the scanning exposure to the first shot region ends, the control unit moves wafer stage WST in the X-axis and Y-axis directions by steps, and moves it to the acceleration starting position for exposure (starting position for scanning exposure) on the second shot area (in other words, a stepping operation between shots is performed).

The control unit then performs scanning exposure in the same manner described above on the second shot area.

In this manner, scanning exposure of the shot area on wafer W and the stepping operation for exposing the next shot area are repeatedly performed, and the circuit pattern of reticle R is sequentially transferred onto all shot areas on wafer W subject to exposure.

In this embodiment, when performing the above scanning exposure onto each shot area on the wafer, the exposure apparatus can fully demonstrate its optical properties. Specifically, helium gas is allowed to flow into barrel 50 of projection optical system PL, nitrogen gas is allowed to flow into reticle chamber 15 and wafer chamber 40, and thus high-accuracy purge is realized where the concentration of low absorptive gas in each inner space is suppressed to several ppm or less. Furthermore, by the operation of the above-described first isolating mechanism 60 and the second isolating mechanism 80, the refraction index of the gas inside barrel 50 of projection optical system PL and the gas inside stage chambers 15, 40 is maintained at a constant level, the deformation of partition wall parallel plates 64, 84 is suppressed, and the fluctuation of the refraction index of partition wall parallel plates 64, 84 is also suppressed. Therefore, gas environment of the space on the optical path of exposure light EL from light source 1 to wafer W is maintained in a substantially ideal environment, and the fluctuation of optical properties caused by the presence of the partition wall parallel plates 64, 84 does not occur, so that illuminance reduction of the exposure light or the occurrence of various aberration is suppressed and highly accurate exposure can be realized.

Furthermore, even with the elapse of time, image forming characteristic of projection optical system PL hardly deteriorates, and the fluctuation of refraction index of gases filled in reticle chamber 15 and wafer chamber 40 is also suppressed. Accordingly, deterioration in the pattern transferred onto wafer W can be prevented.

In addition, because partition wall parallel plates 64 and 84 are severally supported by the three projected portions in this embodiment, in the case of replacing the partition wall parallel plates 64 and 84 (particularly, need of replacing the partition wall parallel plate 84 is high since outgas such as organic substances generated from the resist is attached to the plate), it is possible to attach partition wall parallel plates 64 and 84 to barrel 50 with good reproducibility because partition wall parallel plates 64 and 84 are configured to be severally supported by the three projected portions.

As is clear from the above description, in this embodiment, the first isolating mechanism 60 including the first holding member 62 and the second holding member 66 constitutes a support unit supporting partition wall parallel plate 64 as an optical member, and the second isolating mechanism 80 including the third holding member 82 and the fourth holding member 86 constitutes a support unit supporting partition wall parallel plate 84 as an optical member. Further, exhaust groove 54 and exhaust paths 58 that are formed on the first holding member 62 constitute an exhaust path, and the exhaust groove and the exhaust paths that are formed on the third holding member 82 constitute an exhaust path.

As is described above in detail, according to exposure apparatus 100 of this embodiment, the transmittance of exposure light EL is maintained in a good condition, and the pattern of reticle R can be transferred onto each shot area on wafer W by using projection optical system PL whose optical characteristic is maintained in a good condition. Further, because exposure is performed using exposure light EL in the vacuum ultraviolet region, the resolution of projection optical system PL can be maintained at a high level and a fine pattern can be transferred onto wafer W with good accuracy.

Still further, according to this embodiment, due to the fact that the space on side surface of the partition wall parallel plate 64 is decompressed, stress applied to the upper and lower surfaces of partition wall parallel plate 64 due to decompression can be suppressed significantly smaller when compared to the case of decompressing at least one of space between the upper surface of partition wall parallel plate 64 and the second opposing surface (second clearance CL2) and space between the lower surface of partition wall parallel plate 64 and the first opposing surface (first clearance CL1) Additionally, by decompressing the side surface of partition wall parallel plate 64, gravitational deformation of partition wall parallel plate 64 also can be reduced.

The configuration of the first isolating mechanism 60, the second isolating mechanism 80, and the like described in the above first embodiment is an example, and it goes without saying that the configuration of the support unit according to the present invention is not limited to this. For example, it is not necessary to provide exhaust groove 54 formed on the first holding member 62, but only the exhaust paths may be provided or the exhaust path may be provided only at one position. Alternatively, paths equivalent to the exhaust branch pipelines may be formed on the first holding member 62 and the third holding member 82, and the exhaust main pipeline may be connected to their exit portions. In addition, the exhaust paths may be formed not only on the circumference wall portion of the first and third holding members but also on areas of the first wall or the second wall, which do not oppose the above-described partition wall parallel plates. In short, the exhaust ports of the exhaust paths should face the clearance (such as the third clearance CL3) formed on the side surface of the partition wall parallel plate. Moreover, if another configuration for supporting the optical member is employed in the state where predetermined clearance is formed on a surface of one side and a surface of the other side of the optical member such as the partition wall parallel plate, the projected portions provided on the above-described first holding member and the third holding member are not necessarily be provided.

Furthermore, the drive mechanism for partition wall parallel plates 64 and 84 may be in any configuration as long as it is capable of driving the optical member such as the partition wall parallel plate at least in one direction for the adjustment of the optical properties of the projection optical system PL while outside air is prevented from entering space around the partition wall parallel plate. For example, a configuration can be employed where projected portions move vertically corresponding to screwed amount of a screw. When driving partition wall parallel plates 64 and 84 in this manner, their drive amount is determined such that the surface deformation quantity of partition wall parallel plates 64 and 84, which is caused by the difference between the pressure gradient of the first clearance CL1 and the pressure gradient of the second clearance CL2, falls into an allowable limit. In addition, a configuration for driving the optical member integrally with the support unit may be employed instead of directly driving the optical member.

Further, in the above-described embodiment, the case has been described where the two members of the first holding member and the second holding member constitute the first isolating mechanism 60 as the support unit, but the configuration of the support unit of the present invention is not limited to this. Specifically, a configuration may be employed where the first wall on which the first opposing surface is formed, the second wall on which the second opposing surface is formed, and the third wall on which the third opposing surface is formed are formed by different members, and the members are unified. Further, the support unit of the present invention may support not only the above-described partition wall parallel plate but also other optical members such as lenses. In short, in order to substantially separate one side and the other side of the optical member, the optical members should be supported using the support unit of the present invention.

Figure 5A:
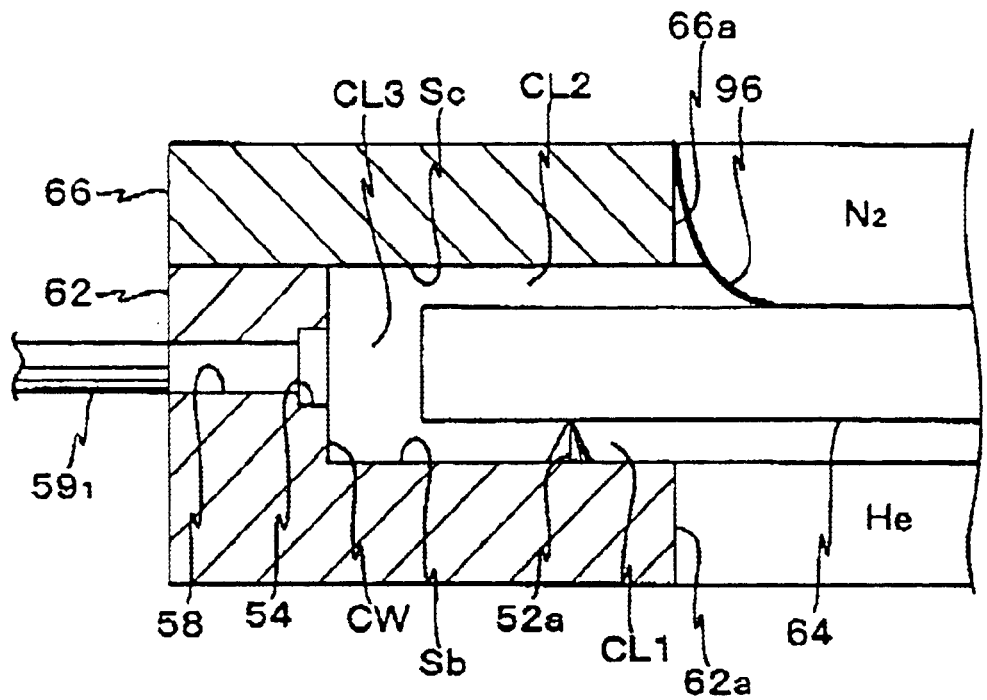
FIGS. 5A and 5B are views for explaining the configuration and the function of the isolating mechanism related to a modified example of the first embodiment.

In the first embodiment, the configuration as shown in FIG. 5A also can be employed as the first isolating mechanism 60. In FIG. 5A, a film-shaped member 96 having a small degas level and certain degree of hardness is provided on the entire inner periphery surface of the second holding member 66. Film-shaped member 96 connects to the inner periphery surface of the second holding member 66, but not connected to partition wall parallel plate 64. Specifically, by providing such film-shaped member 96, film-shaped member 96 is pulled in the direction of exhaust groove 54 when the above-described vacuum pump begins decompression and exhaustion operation. However, since film-shaped member 96 has a certain degree of hardness, the lower end of film-shaped member 96 does not move in the direction of exhaust groove 54 but sticks (adhered) to partition wall parallel plate 64 if the second clearance CL2 is sufficiently small and the film is long enough to close the second clearance CL2 (refer to FIG. 5B). Accordingly, this substantially prevents gas from flowing out from the space above the upper surface of partition wall parallel plate 64, so that gases in the spaces above and below partition wall parallel plate 64 can be prevented from mixing without fail.

As the film-shaped member 96 having a small degas level, EVAL (registered trademark) of Kuraray Co., Ltd. or Kapton (registered trademark) of DuPont Co., Ltd., for example, can be used, and clouding of lenses or the like can be suppressed as much as possible.

Figure 5B:
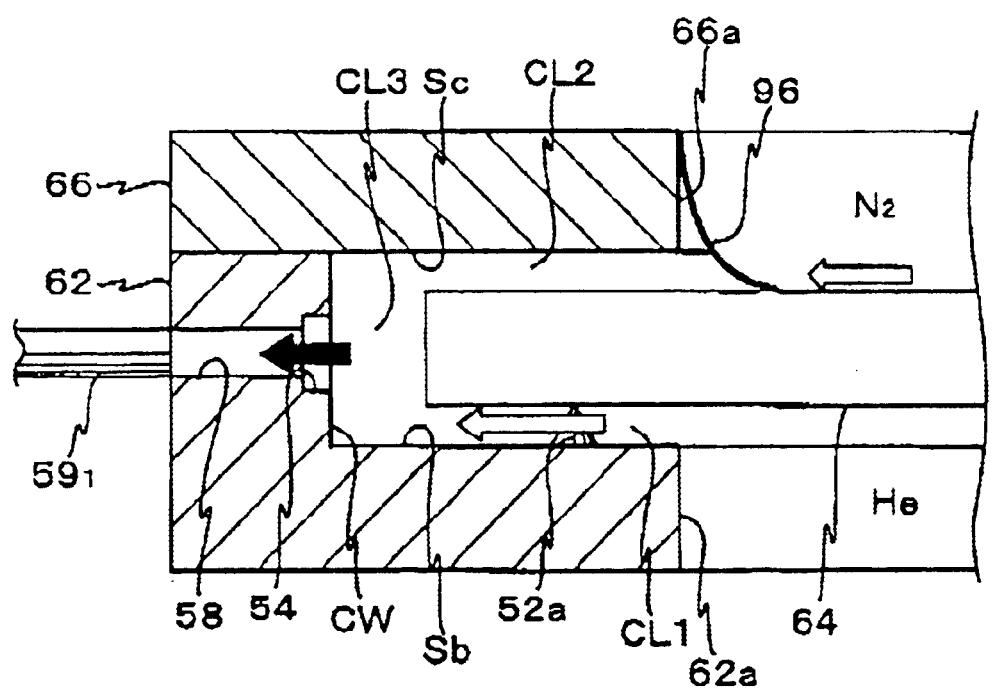

Although FIGS. 5A and 5B describe the case where film-shaped member 96 is provided only in the second clearance CL2, the invention is not limited to this, and film-shaped member 96 may be provided in the first clearance CL1 instead of or together with the second clearance CL2.

The film-shaped member also can be provided in the second isolating mechanism 80.

(Second Embodiment)

Next, a second embodiment of the present invention will be described, referring to FIGS. 6 and 7. For parts that have the same or similar arrangement as the first embodiment previously described, the same reference numerals will be used, and the description thereabout will be brief, or entirely omitted.

In the second embodiment, the only difference when compared with the first embodiment is the configuration or the like of the first isolating mechanism and the second isolating mechanism, and the configuration or the like of the other portions is the same as the first embodiment. Therefore, the following description will focus on such different points.

Figure 6:
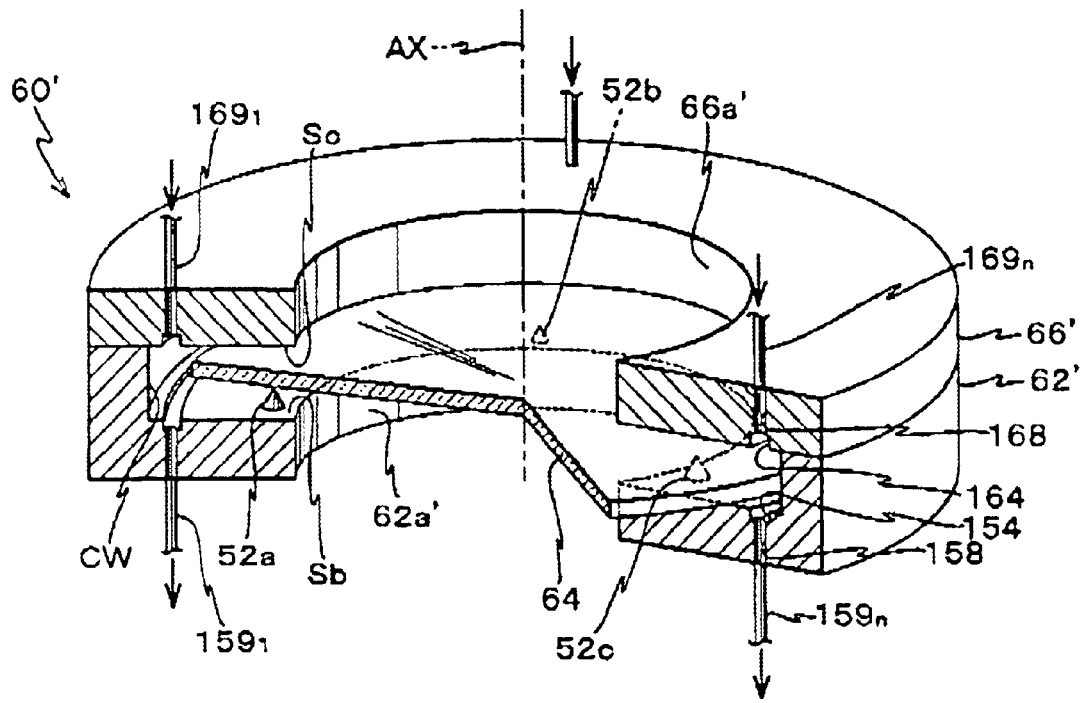
FIG. 6 is a partially broken perspective view of the first isolating mechanism related to a second embodiment of the present invention.
Figure 7:
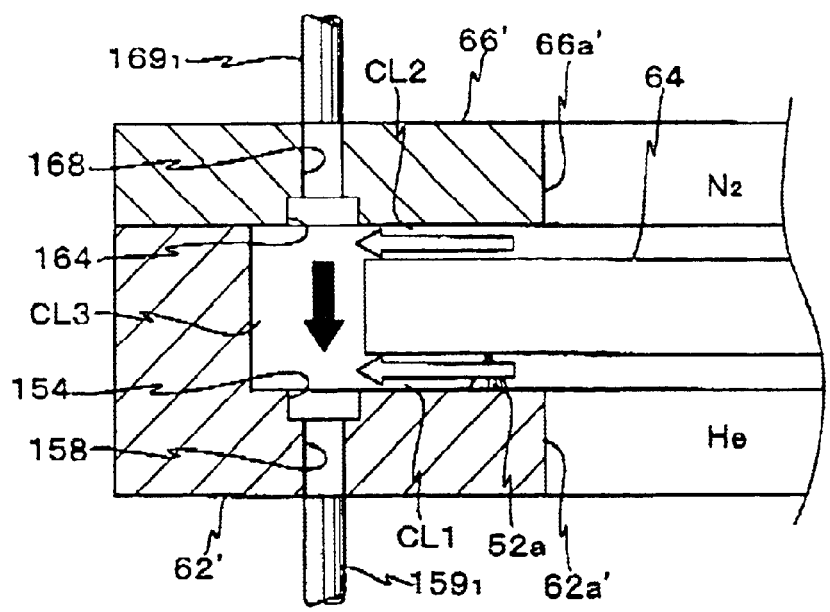
FIG. 7 is a view for explaining the function of the first isolating mechanism related to the second embodiment.

FIG. 6 shows a first isolating mechanism 60' in the second embodiment in a partially broken perspective view. The first isolating mechanism 60' comprises a first holding member 62' same as the above-described first holding member 62, and a second holding member 66' same as the above-described second holding member 66. Projected portions 52a, 52b and 52c are provided on a first opposing surface Sb, which opposes the lower surface of a partition wall parallel plate 64 of the first holding member 62', with a predetermined angular gap similar to the above. Accordingly, partition wall parallel plate 64 opposes the first opposing surface Sb with the first clearance CL1 of about 10 μm also in the second embodiment.

An exhaust groove 154 serving as a first groove is formed on the outer periphery portion of the first opposing surface, which does not oppose partition wall parallel plate 64 directly. At least one, preferably n numbers of exhaust paths 158, which are severally connected to exhaust branch pipelines $159_1$, $159_2$, . . . $159_n$ branched from the above-described exhaust main pipeline 59, are formed on the inner bottom surface of exhaust groove 154 arranged at a predetermined interval. A large number (n) of exhaust paths 158 and exhaust branch pipelines ($159_1$ to $159_n$) actually exist, however, in FIG. 6, only a part of them is shown for the sake of convenience on illustration.

On a second opposing surface Sc of the second holding member 66', which opposes partition wall parallel plate 64, a ring-shaped gas supply groove 164 serving as a second groove, which opposes exhaust groove 154 and has the same shape as exhaust groove 154, is formed, and at least one (preferably in plural numbers with a predetermined gas) of gas supply paths 168 serving as a gas supply port is formed on the inner bottom surface of gas supply groove 164. Gas supply branch pipelines $169_1$, $169_2$, . . . $169_n$ branched from an exhaust main pipeline (not shown) are severally connected to the outside of each gas supply path 168. The end portion of the gas supply main pipeline on the opposite side of the gas supply branch pipelines is connected to the supply unit (not shown) of high-purity helium gas. A large number (n) of gas supply paths 168 and gas supply branch pipelines ($169_1$ to $169_n$) actually exist, however, in FIG. 6, only a part of them is shown for the sake of convenience on illustration.

In this case, the second clearance CL2 of about 10 μm is also formed between partition wall parallel plate 64 and the second opposing surface Sc. Further, the third clearance CL3 of about several mm is formed between the side surface (peripheral surface) of partition wall parallel plate 64 and the third opposing surface that opposes the side surface.

According to the first isolating mechanism 60' of the second embodiment configured as described above, the supply unit (not shown) of high-purity helium gas supplies high-purity helium gas into the third clearance via the gas supply main pipeline, the gas supply branch pipelines, gas supply paths 168, and gas supply groove 164. At this point, when the vacuum pump is in operation and the inside of exhaust paths 158 is in negative pressure via exhaust main pipeline 59 and the exhaust branch pipelines, the helium gas supplied into the third clearance passes through the third clearance from top to bottom, and is forcibly exhausted outside via exhaust groove 154, a plurality of exhaust paths 158, the exhaust branch pipelines, and the exhaust main pipeline. Accordingly, as shown in FIG. 7, high-speed gas flow is formed in the space between the gas supply groove 164 and the exhaust groove 154.

Since the above-described high-speed gas flow decompresses the space near the side surface of partition wall parallel plate 64 according to Bernoulli theorem, the same effect as the first embodiment is obtained and the high-speed gas flow functions as a type of down-flow air curtain, so that the gas can be effectively kept from entering one space to another that are located in the vertical direction with partition wall parallel plate 64 in between.

The second isolating mechanism is configured same as the above-described first isolating mechanism 60', and exerts the same operating effects.

As is obvious from the description so far, exhaust groove 154 and exhaust paths 158 constitute the exhaust route, and gas supply groove 164 and gas supply paths 168 constitute the gas supply route, in the second embodiment.

According to the second embodiment described above, effects equivalent to those of the first embodiment can be obtained.

Furthermore, since the high-speed gas flow is generated in the side surface portion of partition wall parallel plate 64 in the second embodiment, stress applied to the upper and lower surfaces of partition wall parallel plate 64 can be suppressed significantly smaller by decompression due to Bernoulli theorem when compared with the case of generating high-speed gas flow at least in one of the space between the upper surface of partition wall parallel plate 64 and the second opposing surface (first clearance CL1) and the space between the lower surface of the partition wall parallel plate 64 and the first opposing surface (second clearance CL2). Moreover, by generating the high-speed gas flow at the side surface of partition wall parallel plate 64, the gravitational deformation of partition wall parallel plate 64 can be reduced as well.

In the second embodiment, the gas supply groove and the exhaust groove do not need to be provided necessarily. Instead, a plurality of exhaust ports may be formed near the outer periphery portion of partition wall parallel plate 64 with a predetermined gap, and a plurality of gas supply ports may be formed on the lower surface of the second holding member 66', or the gas supply path and the exhaust path may be severally provided on one position.

In addition, in the second embodiment, the gas flow directing from the upper side to the lower side is formed in the third clearance CL3. The invention, however, is not limited to this and gas flow directing from the lower side to the upper side may be formed by forming the gas supply path on the first opposing surface Sb and forming the exhaust path on the second opposing surface Sc.

Figure 8A:
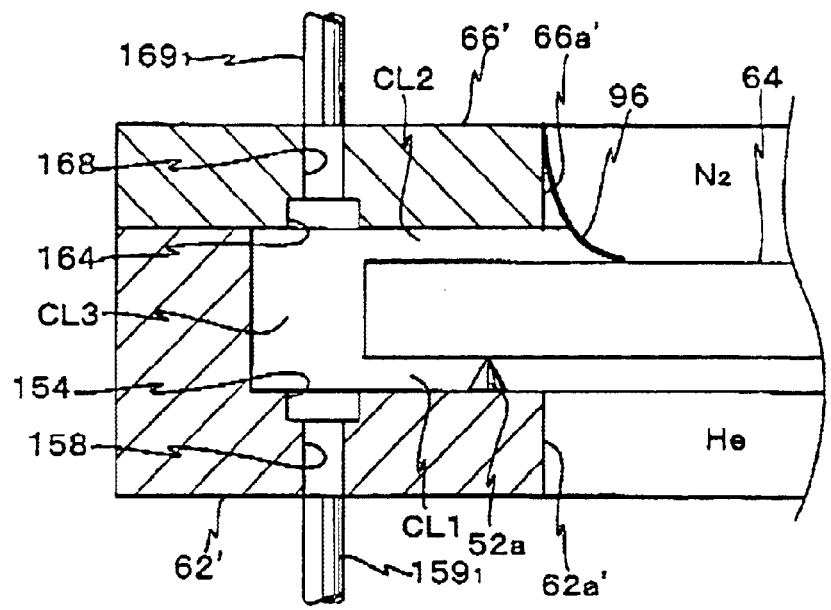
FIGS. 8A and 8B are views for explaining the configuration and the function of the isolating mechanism related to a modified example of the second embodiment.
Figure 8B:
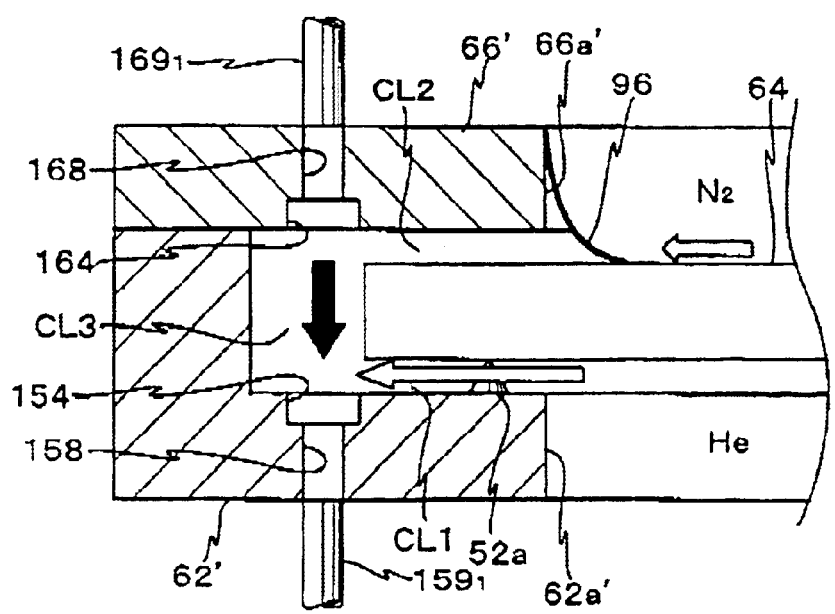

In the above second embodiment, as shown in FIG. 8A, a film-shaped member 96 having a low degas level, which suppresses gas communication inside the second clearance CL2, may be connected to the inner wall of the first holding member 62' in the same manner as the first embodiment.

By providing film-shaped member 96, the film-shaped member is pulled in the direction of the third clearance CL3 when the third clearance CL3 is decompressed by the high-speed gas flow. However, since the film-shaped member 96 has a certain degree of hardness, the lower end of the film-shaped member 96 does not move in the direction of the third clearance CL3 but sticks (adhered) to partition wall parallel plate 64 if the second clearance CL2 is sufficiently small. Accordingly, this prevents gas intrusion from one of the spaces above and below partition wall parallel plate 64 to the other space substantially without fail because the space between the second holding member 66' and partition wall parallel plate 64 is closed.

Gas supply groove 164 and exhaust groove 154 for generating high-speed gas are provided in the second embodiment, but an exhaust route similar to that of the first embodiment may be further formed in combination. Alternatively, with the same configuration as the second embodiment, gas supply groove 164 may be used as an exhaust groove, and a configuration may be employed where both the exhaust groove and exhaust groove 154 are used for decompressing the third clearance.

Figure 9A:
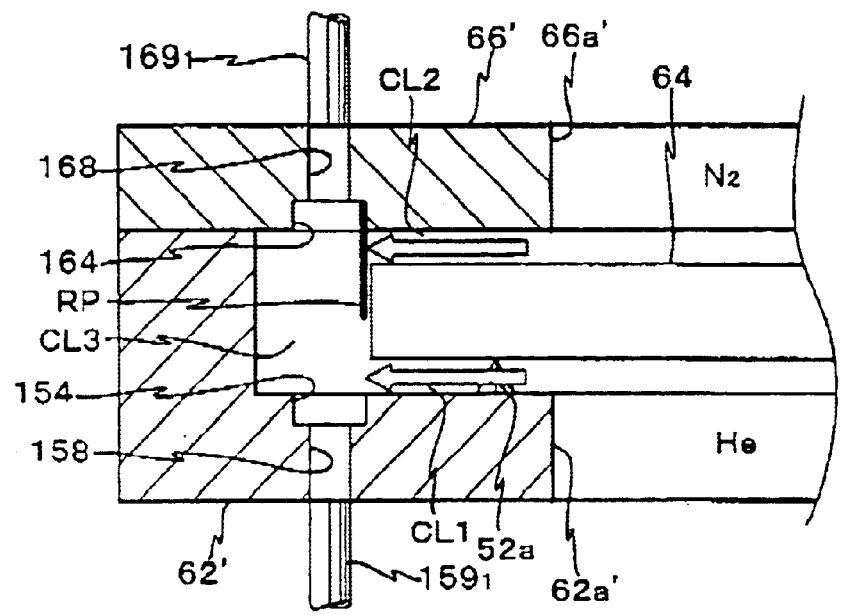
FIG. 9A is a view showing a modified example in which a ring plate is provided in the first isolating mechanism related to the second embodiment.

In the second embodiment, in order to prevent gas flow in a state of an air curtain from leaking into purge space, a ring plate RP may be attached to the inner side portion of gas supply groove 164, as is shown in FIG. 9A. In this case, the space between ring plate RP and the side surface of partition wall parallel plate 64 serving as an optical member is desirably around a few tens of $\mu$m, and the lower end portion of the plate is desirably extended near the neutral surface of partition wall parallel plate 64.

Figure 9B:
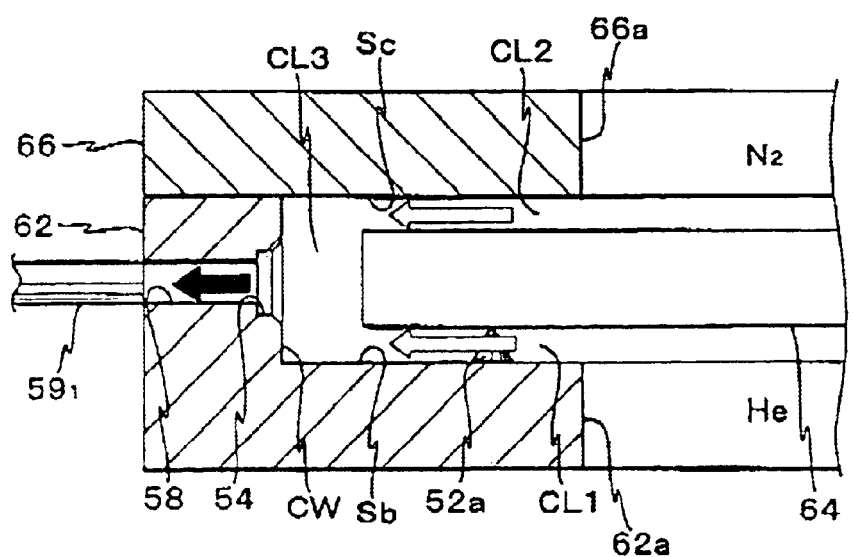
FIG. 9B is a view showing a modified example in which an exhaust groove corner is chipped in the first isolating mechanism related to the first embodiment.

Furthermore, in the first embodiment, the corner portion of exhaust groove 54, which is formed on the inner periphery surface (the third opposing surface) of the circumference wall CW of the first holding member 62, may be chipped off, that is, cut off, as is shown in FIG. 9B. This increases the conductance of gas flow. Similarly, the corner portion of exhaust groove 154 may be chipped off (cut off) also in the second embodiment.

In the above embodiments, the three projected portions 52a to 52c support the partition wall parallel plates 64, 84 only from underneath, however, the invention is not limited to this. A configuration may be employed where three projected portions, each facing projected portions 52a to 52c, are provided on the second and fourth holding members 66, 86, and partition wall parallel plates 64 and 84 are clamped between the projected portions and the opposing projected portions on the lower side.

In the above embodiments, a wafer chamber 40 in which the wafer stage WST is housed and a reticle chamber 15 in which the reticle stage RST is housed are provided, however, instead of wafer chamber 40, the space between partition wall parallel plate 84 and the wafer may be locally purged. Alternatively, instead of wafer chamber 40, the space between partition wall parallel plate 64 and the lower surface of reticle R (or a pellicle (not shown) provided on the lower surface of reticle R) and the space between the light transmittance window 12 and the upper surface of the reticle R are locally purged. may be locally purged. In addition, in each of the embodiments, the case has been described where the parallel flat plate was employed as the partition wall parallel plate. However, the invention is not limited to this, but an optical element having curvature that is a lens, for example, may be employed as the partition wall parallel plate. In this case, a flange portion whose upper and lower surfaces are parallel with each other is provided on the outer periphery portion of the lens, the flange portion is supported at three points from underneath (or from both upper and lower sides), and the side surface portion of the flange portion may be decompressed or high-speed gas flow may be generated at the side surface portion of the flange portion.

In the above embodiments, the first isolating mechanism and the second isolating mechanism are respectively provided at the top end and the bottom end of projection optical system PL and the gas environment inside and outside barrel 50 is isolated. However, the present invention is not limited to this. For example, the first isolating mechanism does not necessarily have to be arranged at the top end of projection optical system PL, and it may be provided at a position on the inner side of the system by a few lenses from a reticle R side. Similarly, the second isolating mechanism also may be provided at a position on the inner side of the system by a few lenses from a wafer W side.

The positional controllability of wafer W is stricter than that of reticle R by the amount of the reduction magnification of the projection optical system (¼ or ⅕, for example). Therefore, the interferometer that measures the position of wafer stage WST on which wafer W is mounted requires a higher accuracy. For this reason, the optical path of the interferometer that measures the position of wafer W may be replaced with helium gas whose refraction index is small and wavelength variation to the changes (fluctuation) of pressure or temperature is small. Accordingly, wafer chamber 40 may be filled with helium gas, as in projection optical system PL in each of the embodiments. In this case, since gas inside projection optical system PL and gas inside wafer chamber 40 are the same, the necessity of providing the second isolating mechanism is not so high as in each of the embodiments above. However, the gas environment of wafer chamber 40 is often disturbed due to maintenance operations of wafer stage WST or the like and wafer exchange, so that it is preferable to provide the second isolating mechanism in order to maintain the purity of replaced gas of projection optical system PL in such occasion. Similarly, helium gas may be filled into reticle chamber 15, and in this case the first isolating mechanism does not necessarily have to be provided. However, the gas environment 40 is often disturbed due to maintenance operations of reticle stage RST or the like and reticle exchange, so that it is preferable to provide the first isolating mechanism in order to maintain the purity of replaced gas of projection optical system PL in such occasion.

Further, since drive sections such as a stage mechanism are arranged in wafer chamber 40 and reticle chamber 15, the concentration of the absorptive gas in wafer chamber 40 and reticle chamber 15 is controlled so that it is maintained higher than that of the absorptive gas in projection optical system PL. In this case, even if the type of low absorptive gas in wafer chamber 40 or reticle chamber 15 is the same as the low absorptive gas inside projection optical system PL, the concentration of the absorptive gas in projection optical system PL can be maintained lower than that of the absorptive gas in wafer chamber 40 or reticle chamber 15 by having at least one of the first isolating mechanism and the second isolating mechanism.

In the case a KrF excimer laser or an ArF excimer laser is used as the light source, reticle chamber 15 and wafer chamber 40 or the like do not necessarily have to be provided. However, even in such a case, the first isolating mechanism and the second isolating mechanism effectively function to maintain the purity of the replacement gas of projection optical system PL.

In each of the above embodiments, the case has been described where the first isolating mechanism and the second isolating mechanism are provided in the projection optical system, however, the arrangement is not limited only to the projection optical system, and it can also be employed in the illumination optical system. In this case, the above-described isolating mechanisms can be provided instead of light transmittance window 12 shown in FIG. 1.

In addition, in each of the above embodiments, the projected portions for holding the lenses and the partition wall parallel plate are provided at three positions, however, the present invention is not limited to this and the projected portions may be provided at four or more positions.

In addition, the material of the lenses (glass material) making up projection optical system PL differs depending on the light source used. When an ArF excimer laser light source or a KrF excimer laser light source is used, both synthetic quartz and fluorite may be used for the lenses, but when the vacuum ultraviolet light source such as an $F_2$ laser light source is used as the light source, all the lenses must be made of fluorite.

The following material may be used other than fluorite: crystals such as lithium fluoride, magnesium fluoride, strontium fluoride, lithium-calcium-aluminum-fluoride, or lithium-strontium-aluminum-fluoride; fluorinated glass made of zirconium-barium-lanthanum-aluminum; improved quartz such as fluorine doped silica glass, fluorine and hydrogen doped silica glass, silica glass containing hydroxyl radicals, silica glass containing fluorine and hydroxyl radicals, or the like.

In addition, the light source of the exposure apparatus in each of the embodiments is not limited to the $F_2$ laser light source, the ArF excimer laser light source, and the KrF excimer laser light source. For example, a device generating a harmonic may also be used, which is obtained by amplifying a single-wavelength laser beam in the infrared or visible range oscillated by a DFB semiconductor laser or a fiber laser with a fiber amplifier doped with erbium (or both erbium and ytterbium), and by converting the wavelength into ultraviolet light using a nonlinear optical crystal. Furthermore, the magnification of the projection optical system is not limited to a reduction system, but an equal magnification system or an enlarged magnification system may also be used.

In each of the above embodiments, the case has been described where the present invention is applied to the scanning exposure apparatus based on the step-and-scan method or the like, however, it goes without saying that the applicable range of the present invention is not limited to this. Specifically, the present invention also can be preferably applied to a reduction projection exposure apparatus based on the step-and-repeat method.

Further, as the floatation method of wafer stage WST and reticle stage RST, it is a matter of course that a method using the floatation force of gas flow can be employed instead of magnetic floatation. In such a case, gas used for floating the stage is preferably nitrogen gas filled in each stage chamber.

The exposure apparatus related to the present invention such as the exposure apparatus 100 in each embodiment can be made by incorporating the illumination optical system made of a plurality of lenses and the projection optical system into the main body of the exposure apparatus and performing optical adjustment while assembling the wafer stage (and the reticle stage in the case of a scanning exposure apparatus) that are made up of various mechanical components into the main body of the exposure apparatus, connecting wiring and piping, assembling each of the partition walls configuring the reticle chamber and the wafer chamber, connecting a gas piping system, connecting each portion to a control system, and furthermore, performing total adjustment (such as electrical adjustment and operational check). The exposure apparatus is preferably manufactured in a clean room where temperature, degree of cleanness, and the like are controlled.

<<Device Manufacturing Method>>

Details on a device manufacturing method when the exposure apparatus described above is used in a lithographic process are described below.

Figure 10:
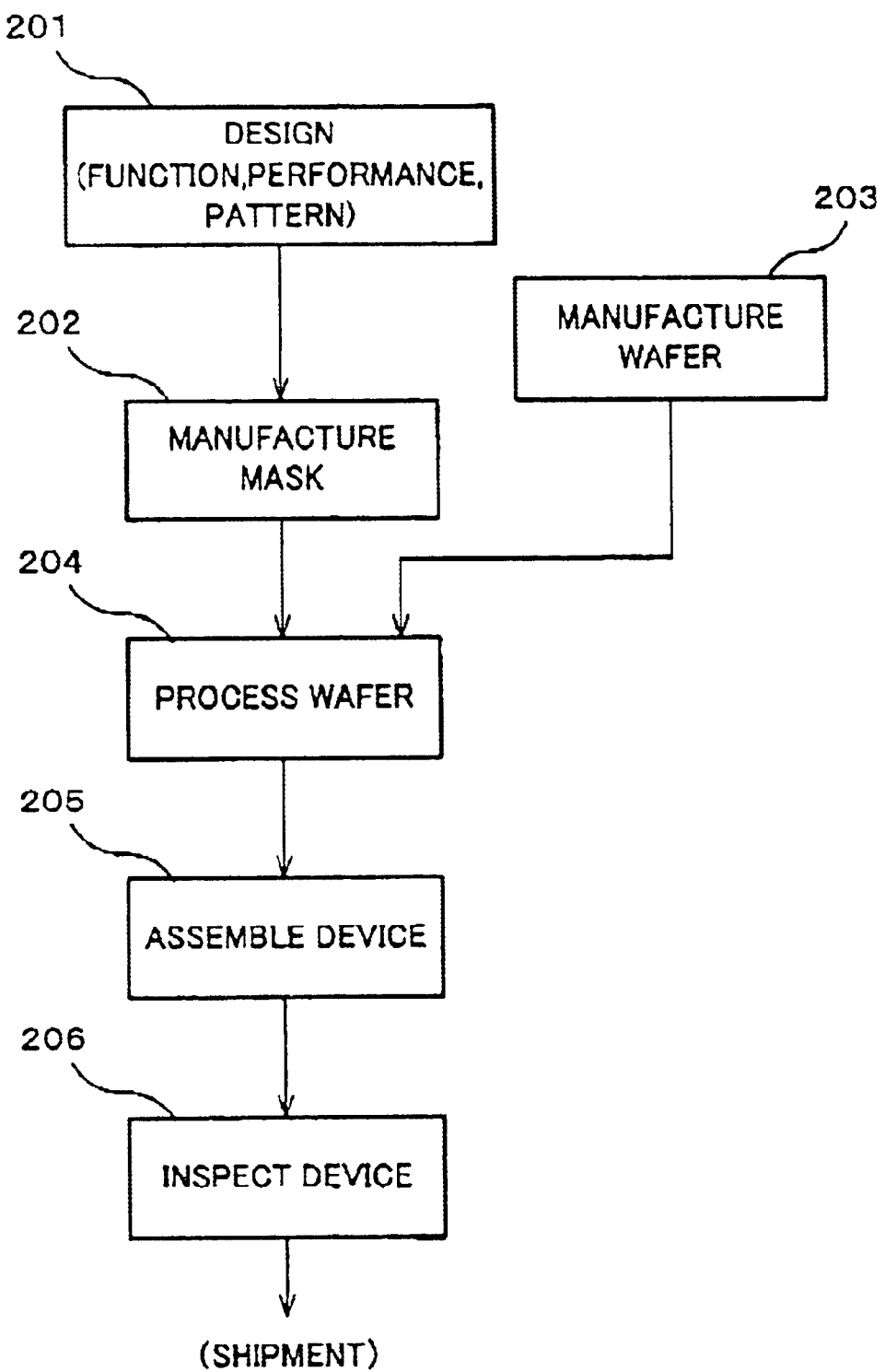
FIG. 10 is a flowchart for explaining the device manufacturing method related to the present invention.

FIG. 10 shows a flow chart of an example when manufacturing a device (like an IC or an LSI as in a semiconductor chip, a liquid crystal panel, a CCD, a thin magnetic head, a micromachine, or the like). As is shown in FIG. 10, in step 201 (design step), the function/performance design of a device (for example, designing a circuit for a semiconductor device) is performed, and pattern design to implement such function is performed. Then, in step 202 (mask manufacturing step), a mask on which the designed circuit pattern is formed is manufactured, whereas, in step 203 (wafer manufacturing step), a wafer is manufactured using materials such as silicon.

Next, in step 204 (wafer processing step), the actual circuit or the like is formed on the wafer by lithography or the like in a manner which will be described later on, using the mask and wafer prepared in steps 201 to 203. Then, in step 205 (device assembly step), device assembly is performed using the wafer processed in step 204. Step 205 includes processes such as the dicing process, the bonding process, and the packaging process (chip encapsulation) when necessary.

Finally, in step 206 (inspection step), tests on operation, durability, and the like are performed on the devices made in step 405. After these steps, the devices are completed and shipped out.

Figure 11:
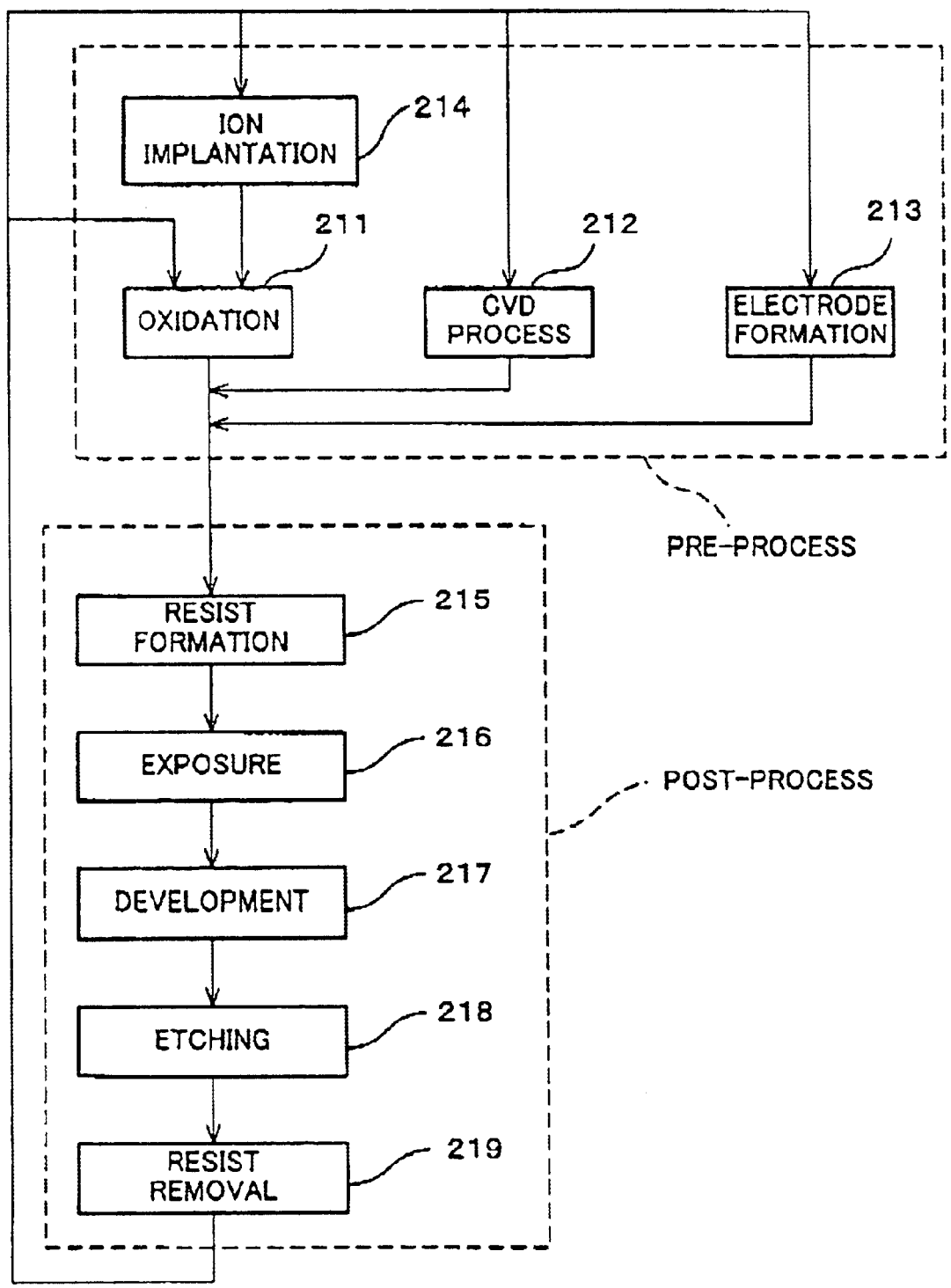
FIG. 11 is a flowchart showing a specific example of step 204 of FIG. 10.

FIG. 11 is a flow chart showing a detailed example of step 204 described above when manufacturing a semiconductor device. Referring to FIG. 11, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above make up a pre-process in each stage of wafer processing, and the necessary processing is chosen and is executed at each stage.

When the above pre-process is completed in each stage of wafer processing, a post-process is executed in the manner described below. In this post-process, first, in step 215 (resist formation step), the wafer is coated with a photosensitive agent. Next, in step 216 (exposure step), the circuit pattern on the mask is transferred onto the wafer by the exposure apparatus and the exposure method described above. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing such pre-process and post-process, multiple circuit patterns are formed on the wafer.

When using the device manufacturing method described above in the embodiment, since the exposure apparatus described in the embodiment above is used in the exposure process (step 216), the pattern of the reticle can be transferred onto the wafer with good precision for a long period of time. As a consequence, the productivity (including yield) of highly integrated devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A support unit that supports a light transmissive optical member arranged on an optical path of an energy beam, said unit comprising:

a first wall that has a first opening that becomes a path of said energy beam, and a first opposing surface facing the vicinity of an outer periphery portion of one surface of said optical member via a predetermined first clearance;

a second wall that has a second opening that becomes a path of said energy beam, and a second opposing surface facing the vicinity of an outer periphery portion of the other surface of said optical member via a predetermined second clearance; and a third wall that has a third opposing surface facing the entire side surface of said optical member via a predetermined third clearance, wherein at least one of said first to third walls has a part of an exhaust path to exhaust gas inside said third clearance outside.

2. The support unit according to claim 1, wherein
said third opposing surface has at least one exhaust port that makes up a part of said exhaust path.

3. The support unit according to claim 2, wherein
said third opposing surface has a groove that is formed on the entire circumference of said third opposing surface, and has a predetermined depth making up a part of said exhaust path, and at least one of said exhaust port is formed inside said groove.

4. The support unit according to claim 1, wherein
one wall of said first wall and said second wall has at least one exhaust port that makes up a part of said exhaust path at a position excluding the area where said wall faces said optical member, and
the other wall of said first wall and said second wall has at least one gas supply port that makes up a part of gas supply path for supplying gas into said third clearance.

5. The support unit according to claim 4, wherein
said one wall has a first groove of a ring shape having a predetermined depth, which makes up a part of said exhaust path, at a position excluding the area where said wall faces said optical member, and at least one of said exhaust port is formed inside said first groove, and
said other wall has a second groove of a ring shape having a predetermined depth, which makes up a part of said gas supply path, at a position excluding the area where the wall faces the optical member, and at least one of said gas supply port is formed inside said second groove.

6. The support unit according to claim 4, said unit further comprising:
a gas supply unit that supplies a predetermined gas into said third clearance via said gas supply path.

7. The support unit according to claim 1, said unit further comprising:
a gas exhaust unit that decompresses the inside of said exhaust path and exhausts gas inside said third clearance.

8. The support unit according to claim 1, said unit further comprising:
a film-shaped member that has a low degas level, which is provided at a section between at least one of said first wall and said second wall and said optical member, in a state where said film-shaped member blocks a gas flow between said optical member and said at least one of said first wall and said second wall.

9. The support unit according to claim 1, wherein
said first wall has at least three first projected portions that support said optical member in direct contact in at least three points.

10. The support unit according to claim 9, wherein
said second wall has at least three second projected portions that respectively face each of said first projected portions and clamp said optical member with said opposing first projected portions.

11. The support unit according to claim 1, said unit further comprising:
a drive mechanism that is connected to said optical member and drives said optical member in at least one of a first axis direction, which is a propagating direction of said energy beam, and a direction of inclination with respect to a plane orthogonal to said first axis.

12. The support unit according to claim 1, wherein
said first clearance and said second clearance are a clearance whose dimension is substantially the same.

13. An optical unit arranged on an optical path of an energy beam, said unit comprising:
a barrel; and
at least one support unit according to claim 1, which is provided in a part of said barrel in a state where said optical member is positioned on said optical path of said energy beam.

14. The optical unit according to claim 13, wherein
said optical member separates spaces of different gas atmosphere from each other.

15. The optical unit according to claim 13, wherein
said support unit is severally provided on both the incident end portion and the exit end portion of said energy beam of said barrel.

16. The optical unit according to claim 15, wherein
the inside and the outside of said barrel are gas spaces of different types.

17. The optical unit according to claim 13, wherein
said support unit is disposed in between the incident end portion of said barrel and the exit end portion of said barrel.

18. An exposure apparatus that exposes an object by an energy beam and forms a predetermined pattern on said object, said apparatus comprising:
a light source that generates said energy beam; and
the optical unit according to claim 13 which is disposed on an optical path of said energy beam from said light source to said object.

19. A device manufacturing method including a lithographic process, wherein
exposure is performed using the exposure apparatus according to claim 18 in said lithographic process.

20. An exposure apparatus that exposes an object by an energy beam and forms a predetermined pattern on said object, said exposure apparatus comprising:
a first wall that has a first opening that becomes a path of said energy beam, and a first opposing surface facing the vicinity of an outer periphery portion of one surface of said optical member via a predetermined first clearance;
a second wall that has a second opening that becomes a path of said energy beam, and a second opposing surface facing the vicinity of an outer periphery portion of the other surface of said optical member via a predetermined second clearance; and
a third wall that has a third opposing surface facing the entire side surface of said optical member via a predetermined third clearance, wherein
at least one of said first to third walls has a part of an exhaust path to exhaust gas inside said third clearance outside.

21. The exposure apparatus according to claim 20, wherein
said third opposing surface has at least one exhaust port that makes up a part of said exhaust path.

22. The exposure apparatus according to claim 21, wherein
said third opposing surface has a groove that is formed on the entire circumference of said third opposing surface, and has a predetermined depth making up a part of said exhaust part, and at least one of said exhaust port is formed inside said groove.

23. The exposure apparatus according to claim 20, wherein
one wall of said first wall and said second wall has at least one exhaust port that makes up a part of said exhaust path at a position excluding the area where said wall faces said optical member, and the other wall of said first wall and said second wall has at least one gas supply port that makes up a part of gas supply path for supplying gas into said third clearance.

24. The exposure apparatus according to claim 23, wherein said one wall has a first groove of a ring shape having a predetermined depth, which makes up a part of said exhaust path, at a position excluding the area where said wall faces said optical member, and at least one of said exhaust port is formed inside said first groove, and said other wall has a second groove of a ring shape having a predetermined depth, which makes up a part of said gas supply path, at a position excluding the area where the wall faces the optical member, and at least one of said gas supply port is formed inside said second groove.

25. The exposure apparatus according to claim 23, said exposure apparatus further comprising:

a gas supply unit that supplies a predetermined gas into said third clearance via said gas supply path.

26. The exposure apparatus according to claim 20, said exposure apparatus further comprising:

a gas exhaust unit that decompresses the inside of said exhaust path and exhausts gas inside said third clearance.

27. The exposure apparatus according to claim 20, said exposure apparatus further comprising:

a drive mechanism that is connected to said optical member and drives said optical member in at least one of a first axis direction, which is a propagating direction of said energy beam, and a direction of inclination with respect to a plane orthogonal to said first axis.

* * * * *

UNITED STATES PATENT AND TRADEMARK OFFICE
CERTIFICATE OF CORRECTION

PATENT NO.         : 7,009,687 B2
APPLICATION NO. : 10/969071
DATED                 : March 7, 2006
INVENTOR(S)       : Takashi Aoki Page 1 of 1

It is certified that error appears in the above-identified patent and that said Letters Patent is hereby corrected as shown below:

On the face of the patent, please change "6,583,850 B1" under U.S. PATENT DOCUMENTS of Section (56) to -- 6,583,850 B2 --; and On the face of the patent, please change "6,633,364 B1" under U.S. PATENT DOCUMENTS of Section (56) to -- 6,633,364 B2 --; and On the face of the patent, please change "6,686,989 B1" under U.S. PATENT DOCUMENTS of Section (56) to -- 6,686,989 B2 --; and On the face of the patent, please delete "JP 2001123364" under FOREIGN PATENT DOCUMENTS of Section (56) and insert therefor -- JP 2001-242364 --.

Signed and Sealed this

Seventh Day of November, 2006

JON W. DUDAS
*Director of the United States Patent and Trademark Office*